(12) United States Patent
Machida et al.

(10) Patent No.: US 12,101,949 B2
(45) Date of Patent: Sep. 24, 2024

(54) PHOTOELECTRIC CONVERSION ELEMENT, ELECTRONIC DEVICE, AND LIGHT-EMITTING DEVICE

(71) Applicant: Panasonic Intellectual Property Management Co., Ltd., Osaka (JP)

(72) Inventors: Shinichi Machida, Osaka (JP); Katsuya Nozawa, Osaka (JP); Sanshiro Shishido, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 297 days.

(21) Appl. No.: 17/700,941

(22) Filed: Mar. 22, 2022

(65) Prior Publication Data

US 2022/0216440 A1 Jul. 7, 2022

Related U.S. Application Data

(63) Continuation of application No. PCT/JP2020/037788, filed on Oct. 6, 2020.

(30) Foreign Application Priority Data

Oct. 31, 2019 (JP) .................. 2019-198673

(51) Int. Cl.
  *H10K 30/82* (2023.01)
  *H10K 39/32* (2023.01)
  *H10K 85/20* (2023.01)

(52) U.S. Cl.
  CPC ........... *H10K 30/821* (2023.02); *H10K 39/32* (2023.02); *H10K 85/221* (2023.02)

(58) Field of Classification Search
  CPC .... H10K 30/821; H10K 39/32; H10K 85/221; H10K 30/30; Y02E 10/549;
  (Continued)

(56) References Cited

U.S. PATENT DOCUMENTS

| 2008/0283883 A1* | 11/2008 | Shim | ...................... H10K 39/32 |
| | | | 257/292 |
| 2012/0187394 A1* | 7/2012 | Hatano | ................ H01G 9/2068 |
| | | | 257/E31.127 |

(Continued)

FOREIGN PATENT DOCUMENTS

| JP | 5-259486 | 10/1993 |
| JP | 05259486 A | * 10/1993 |

(Continued)

OTHER PUBLICATIONS

International Search Report of PCT application No. PCT/JP2020/037788 dated Dec. 15, 2020.

(Continued)

*Primary Examiner* — S M Sohel Imtiaz
(74) *Attorney, Agent, or Firm* — Rimon P.C.

(57) ABSTRACT

A photoelectric conversion element includes: a first electrode; a second electrode; and a photoelectric conversion layer disposed between the first electrode and the second electrode and containing semiconducting carbon nanotubes and a first material that functions as a donor or an acceptor for the semiconducting carbon nanotubes. The semiconducting carbon nanotubes have light absorption characteristics including a first absorption peak at a first wavelength, a second absorption peak at a second wavelength shorter than the first wavelength, and a third absorption peak at a third wavelength shorter than the second wavelength. The first material is transparent to light in at least one wavelength range selected from the group consisting of a first wavelength range between the first wavelength and the second wavelength and a second wavelength range between the second wavelength and the third wavelength.

16 Claims, 15 Drawing Sheets

(58) Field of Classification Search
CPC ....... H01L 27/146; H01L 31/08; H01L 31/10; H01L 27/14665; H01L 31/0328
See application file for complete search history.

(56) References Cited

U.S. PATENT DOCUMENTS

| | | | |
|---|---|---|---|
| 2018/0019363 A1* | 1/2018 | Takahashi | H01L 31/102 |
| 2018/0047788 A1* | 2/2018 | Nozawa | H10K 85/221 |
| 2018/0331293 A1 | 11/2018 | Hayashida et al. | |

FOREIGN PATENT DOCUMENTS

| | | |
|---|---|---|
| JP | 2006-270061 | 10/2006 |
| JP | 2007-194557 | 8/2007 |
| JP | 2017-028234 | 2/2017 |
| JP | 2017-201695 | 11/2017 |
| JP | 2018-195809 | 12/2018 |
| WO | 2017/006520 | 1/2017 |

OTHER PUBLICATIONS

Yasuhiko Hirana et al., "Empirical Prediction of Electronic Potentials of Single-Walled Carbon Nanotubes With a Specific Chirality(n,m)", Scientific Reports, vol. 3, 2959, Oct. 16, 2013.
Dominick J. Bindl et al., "Efficiently Harvesting Excitons from Electronic Type-Controlled Semiconducting Carbon Nanotube Films", Nano Letters, 2011, 11, Dec. 17, 2010, pp. 455-460.
Wei Li et al., "Visible to Near-Infrared Photodetection Based on Ternary Organic Heterojunctions", Advanced Functional Materials, vol. 29, Mar. 26, 2019, pp. 1808948-1-1808948-7.
Yongxi Li et al., "Near-Infrared Ternary Tandem Solar Cells", Advanced Materials, vol. 30, Oct. 1, 2018, pp. 1804416-1-1804416-7.

* cited by examiner

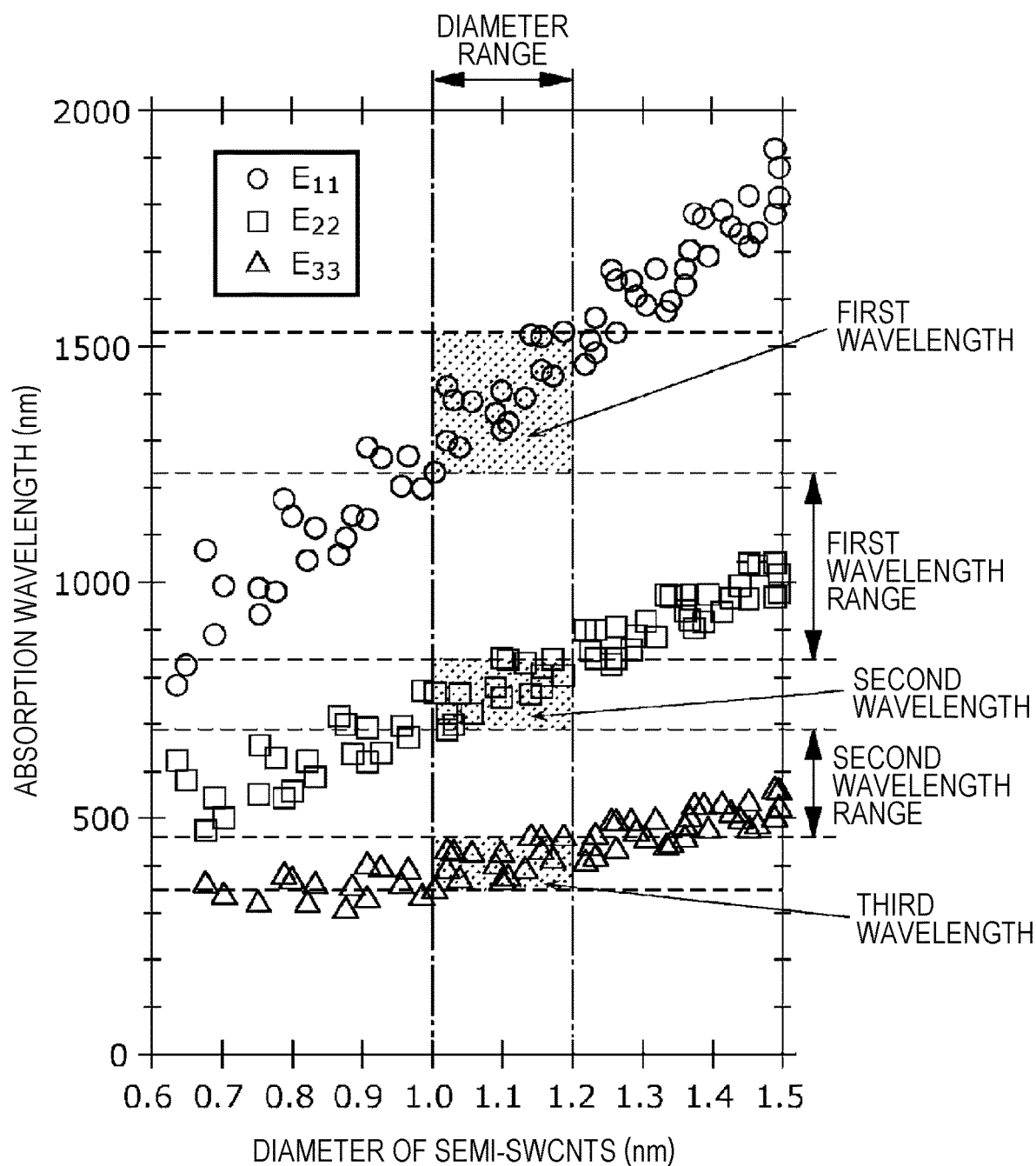

PHOTOELECTRIC CONVERSION ELEMENT, ELECTRONIC DEVICE, AND LIGHT-EMITTING DEVICE

BACKGROUND

1. Technical Field

The present disclosure relates to a photoelectric conversion element, an electronic device, and a light-emitting device.

2. Description of the Related Art

Semiconducting single-walled carbon nanotubes have a bandgap corresponding to absorption of light in the near infrared region, good carrier transport properties, and a large absorption coefficient reflecting their specific density of states and have been studied as promising materials for photoelectric conversion elements such as solar batteries and photosensors. In the following description, the semiconducting single-walled carbon nanotubes may be referred to as semi-SWCNTs (Single-Walled Carbon NanoTubes). The semi-SWCNTs differ in diameter and light absorption characteristics depending on their chirality represented by indices (n, m).

Japanese Patent No. 6161018 discloses an imaging device including a photoelectric conversion layer containing semiconducting carbon nanotubes as a donor or an acceptor.

"Efficiently harvesting excitons from electronic type-controlled semiconducting carbon nanotube films" D. J. Bindl et al., Nano Letters, Vol. 11, p 455-460, 2011 (Non Patent Literature 1) discloses a solar battery utilizing a multilayer structure including a semi-SWCNT layer and a $C_{60}$ fullerene layer.

SUMMARY

In one general aspect, the techniques disclosed here feature a photoelectric conversion element including: a first electrode; a second electrode; and a photoelectric conversion layer disposed between the first electrode and the second electrode and containing semiconducting carbon nanotubes and a first material that functions as a donor or an acceptor for the semiconducting carbon nanotubes. The semiconducting carbon nanotubes have light absorption characteristics including a first absorption peak at a first wavelength, a second absorption peak at a second wavelength shorter than the first wavelength, and a third absorption peak at a third wavelength shorter than the second wavelength. The first material is transparent to light in at least one wavelength range selected from the group consisting of a first wavelength range between the first wavelength and the second wavelength and a second wavelength range between the second wavelength and the third wavelength.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5B is a graph showing the first wavelength range and the second wavelength range when the diameter range of the semi-SWCNTs is 1.1 nm±0.1 nm;

DETAILED DESCRIPTIONS (Underlying Knowledge Forming Basis of Embodiments of the Present Disclosure)

In semi-SWCNTs, since the binding energy of excitons is as high as several hundreds of meV, the excitons cannot be easily dissociated at room temperature. Therefore, in Non Patent Literature 1, to dissociate excitons into electrons and holes, a $C_{60}$ fullerene layer is stacked on a semi-SWCNT layer to form a heterostructure at the interface between the semi-SWCNT layer and the $C_{60}$ fullerene layer. Excitons, i.e., electron-hole pairs, diffuse to the interface between the semi-SWCNT layer and the $C_{60}$ fullerene layer, i.e., the heterointerface. Then the electrons in the excitons move to the $C_{60}$ fullerene layer by utilizing the energy offset at the heterointerface, and the holes in the excitons move to the semi-SWCNT layer. Therefore, the electrons and holes in the excitons serve as charge carriers and move to external electrodes.

However, the $C_{60}$ fullerene exhibits absorption at a wavelength in the visible range. Therefore, in the spectral sensitivity spectrum of a photoelectric conversion material containing a combination of the semi-SWCNTs and the $C_{60}$ fullerene, the photoelectric conversion material has sensitivity in a wide wavelength range extending from the visible range to the near infrared range. For example, in applications such as house roofs that are not necessary to allow light to pass therethrough, a solar battery having sensitivity to light in a wider wavelength range in the light incident on the solar battery is effective. However, for example, in applications such as solar batteries mounted on windows, when light with wavelengths in the visible range is absorbed, the visible light cannot be introduced into the room sufficiently. In this case, the function of the windows is inhibited. This is also the case for applications in which transmitted light is utilized actively.

The present inventors have conducted studies on photoelectric conversion elements that transmit light in a specific wavelength range. The inventors have found that a photoelectric conversion element that allows light in a specific wavelength range, e.g., visible light, to pass therethrough can be obtained by using a combination of semi-SWCNTs having a specific chirality and a specific material.

Figure 1A:
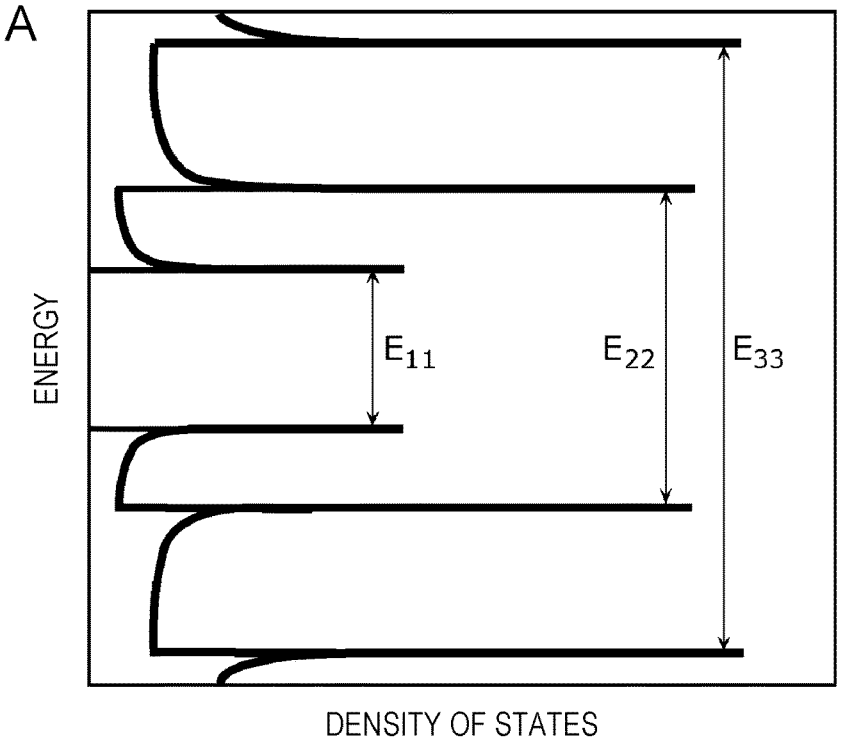
FIG. 1A is a graph showing the relation between the density of states of semi-SWCNTs and optical transitions.
Figure 1B:
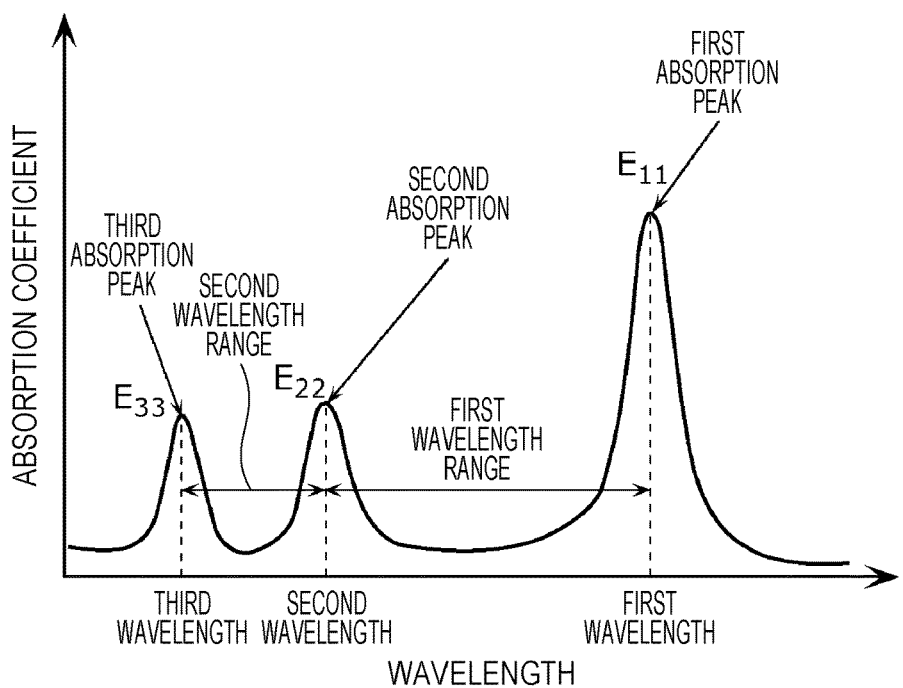
FIG. 1B is a schematic illustration showing an example of the absorption spectrum of semi-SWCNTs.

FIG. 1A is a graph showing the relation between the density of states of semi-SWCNTs and optical transitions. FIG. 1B is a schematic illustration showing an example of the absorption spectrum of the semi-SWCNTs. As shown in FIG. 1A, the density of states of the semi-SWCNTs has discrete peaks called van Hove singularities in the valence band and the conduction band, and the semi-SWCNTs have strong and sharp optical absorption transitions with energies corresponding to the gaps between these peaks of the density of states. The optical transition energies of these optical absorption transitions are optical transition energies $E_{11}$, $E_{22}$, and $E_{33}$ in ascending order of energy. Specifically, the i-th lowest optical transition energy is the optical transition energy $E_{ii}$. These optical absorption transitions are sometimes called the $E_{11}$ transition, the $E_{22}$ transition, and the $E_{33}$ transition in ascending order of optical transition energy. Specifically, the i-th lowest optical absorption transition is the $E_{ii}$ transition. Therefore, as shown in FIG. 1B, the absorption spectrum of the semi-SWCNTs has absorption peaks in narrow wavelength bands corresponding to the $E_{11}$, $E_{22}$, and $E_{33}$ transitions from the low energy side, i.e., from the long wavelength side, and the semi-SWCNTs exhibit almost no absorption in other wavelength ranges.

Figure 2A:
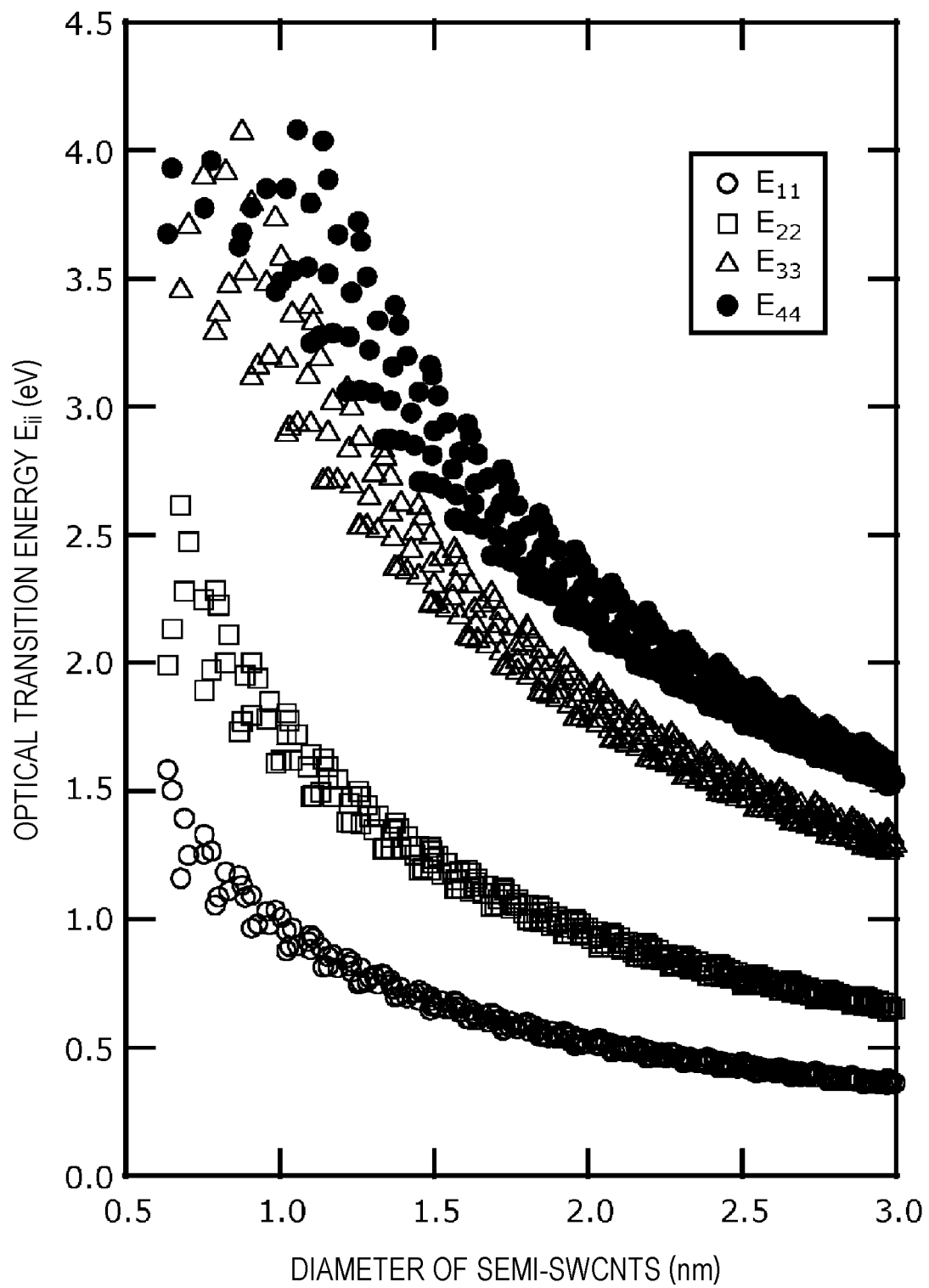
FIG. 2A is a graph showing the relation between the diameter of semi-SWCNTs and optical transition energy.
Figure 2B:
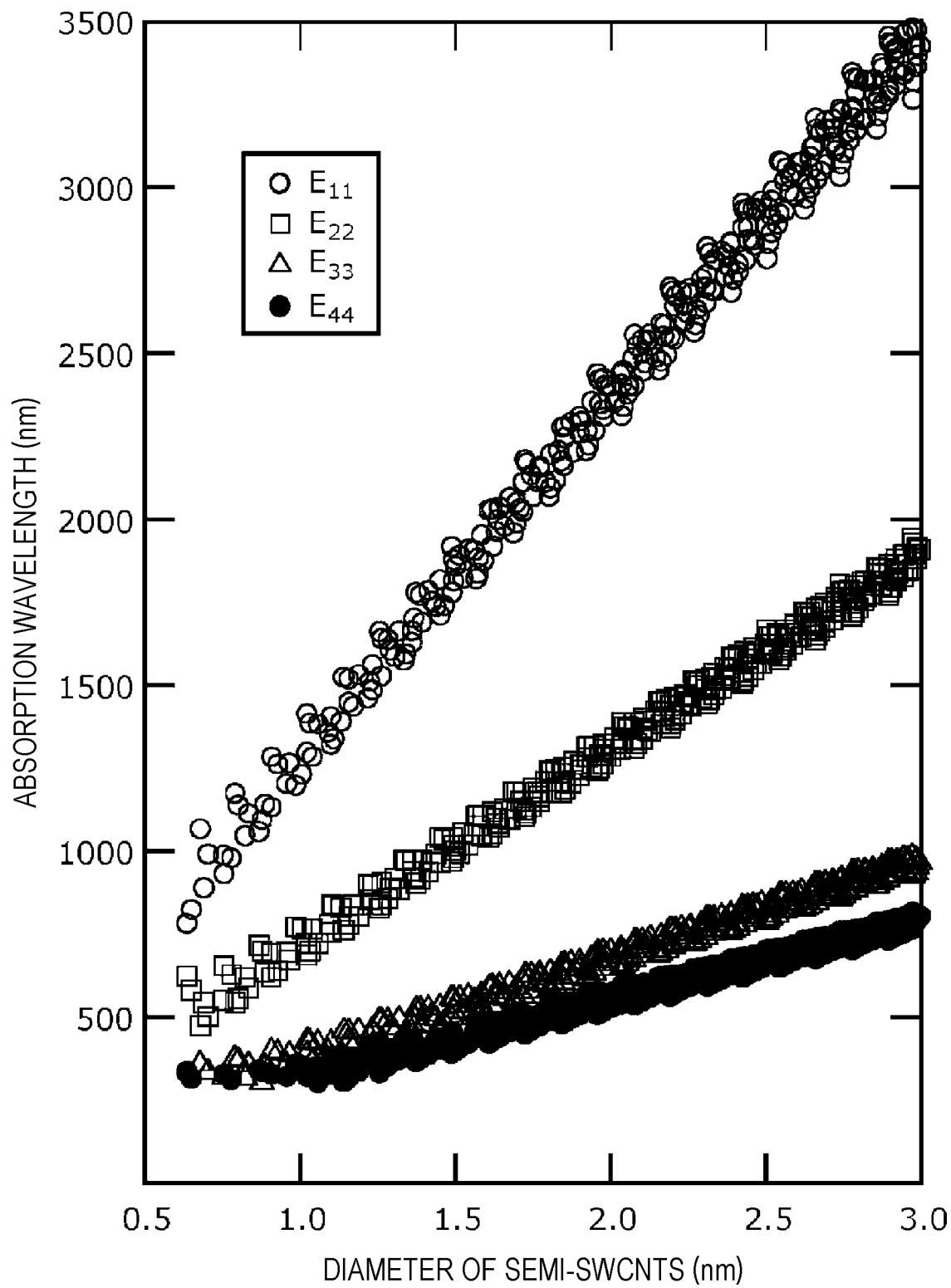
FIG. 2B is a graph showing the relation between the diameter of the semi-SWCNTs and absorption wavelength.

FIG. 2A is a graph showing the relation between the diameter of semi-SWCNTs and optical transition energies. FIG. 2B is a graph showing the relation between the diameter of the semi-SWCNTs and the absorption wavelength. The graph in FIG. 2B shows the optical transition energies $E_{11}$ in FIG. 2A converted to light absorption wavelengths corresponding the energies. As shown in FIG. 2A, each optical transition energy $E_{ii}$ depends on the diameter of the semi-SWCNTs. As can be seen from FIG. 2B, as the diameter of the semi-SWCNTs increases, the absorption wavelength corresponding to the optical transition energy $E_{ii}$ is shifted to the longer wavelength side. Attention is now given to a certain diameter. Then it can be seen that the gaps between the absorption wavelengths corresponding to the optical transition energies $E_{11}$, $E_{22}$, and $E_{33}$ are equal to or larger than 50 nm. For example, when the diameter of the semi-SWCNTs is about 1 nm, the absorption wavelengths corresponding to the optical transition energies $E_{11}$, $E_{22}$, and $E_{33}$ are in the range of 1300 nm or longer and 1400 nm or shorter, the range of 700 nm or longer and 800 nm or shorter, and the range of 350 nm or longer and 450 nm or shorter, respectively, and almost no light absorption occurs at wavelengths between these absorption wavelengths. In other words, the semi-SWCNTs having a diameter of 1 nm can be a medium optically transparent to wavelengths equal to or longer than 450 nm and equal to or shorter than 700 nm and wavelengths equal to or longer than 800 nm and equal to or shorter than 1300 nm. Therefore, by combining a semiconductor transparent to wavelengths equal to or longer than 450 nm and equal to or shorter than 700 nm and semi-SWCNTs having a diameter of 1 nm to form heterointerfaces, a photoelectric conversion element that is transparent to visible light and performs photoelectric conversion at an absorption wavelength corresponding to an optical transition energy $E_{ii}$ can be obtained.

Aspects of the present disclosure will be summarized below.

A photoelectric conversion element according to one aspect of the present disclosure includes: a first electrode; a second electrode; and a photoelectric conversion layer disposed between the first electrode and the second electrode and containing semiconducting carbon nanotubes and a first material that functions as a donor or an acceptor for the semiconducting carbon nanotubes. The semiconducting carbon nanotubes have light absorption characteristics including a first absorption peak at a first wavelength, a second absorption peak at a second wavelength shorter than the first wavelength, and a third absorption peak at a third wavelength shorter than the second wavelength. The first material is transparent to light in at least one wavelength range selected from the group consisting of a first wavelength range between the first wavelength and the second wavelength and a second wavelength range between the second wavelength and the third wavelength.

In the above photoelectric conversion element, the photoelectric conversion layer has absorption peaks at the first, second, and third wavelengths. Therefore, the photoelectric conversion layer has sensitivity in wavelength ranges including these wavelengths and allows light in the first and second wavelength ranges to pass therethrough. The first material that functions as a donor or an acceptor required to dissociate electron-hole pairs generated in the semiconducting carbon nanotubes through light absorption into electrons and holes is transparent to light in at least one of the first wavelength range or the second wavelength range. Therefore, the photoelectric conversion element allows light in the at least one of the first wavelength range or the second wavelength range to pass therethrough. Thus, the photoelectric conversion element obtained has sufficient optical transparency in a specific wavelength range and has an optical response in another wavelength range different from the specific wavelength range.

For example, the second wavelength range may include a wavelength range of 400 nm or longer and 650 nm or shorter.

In this case, when the first material is transparent to light in the wavelength range of 400 nm or longer and 650 nm or shorter, the photoelectric conversion element obtained allows visible light in the wavelength range of 400 nm or longer and 650 nm or shorter to pass therethrough.

For example, the first wavelength may be equal to or longer than 1300 nm and equal to or shorter than 1600 nm.

In this case, the photoelectric conversion element has sensitivity in the wavelength range of 1300 nm or longer and 1600 nm or shorter that includes a wavelength band in the spectrum of sunlight on the surface of the earth, in which wavelength band the intensity of light is attenuated by absorption by the air. Therefore, when the photoelectric conversion element is used for an imaging device, the imaging device can capture an image of an object based on reflection of illumination light separately directed to the object without being affected by sunlight, so that images with the same quality can be captured at both day and night.

For example, the semiconducting carbon nanotubes may include a semiconducting carbon nanotube having at least one chirality selected from the group consisting of (8,7), (14,0), (13,2), (9,7), (11,4), (12,2), (12,4), (10,6), (13,0), (11,6), (9,8), (15,1), (14,3), (10,8), (13,3), (14,1), (13,5), (12,5), (11,7), (17,0), (12,7), (16,2), and (10,9).

When semiconducting carbon nanotubes having any of the above chiralities are included, the first wavelength of the semiconducting carbon nanotubes is equal to or longer than 1300 nm and equal to or shorter than 1600 nm.

For example, the first wavelength may be equal to or longer than 1500 nm and equal to or shorter than 1800 nm.

In this case, the photoelectric conversion element has sensitivity in a wavelength range in which the intensity of nightglow, which is infrared light emitted by the air in the sky at night, is high irrespective of the phase of the moon. Therefore, when the photoelectric conversion element is used for an imaging device, the imaging device can capture images outdoors at night without any illumination.

For example, the semiconducting carbon nanotubes may include a semiconducting carbon nanotube having at least one chirality selected from the group consisting of (10,8), (13,3), (14,1), (13,5), (12,5), (11,7), (17,0), (12,7), (16,2), (10,9), (15,4), (14,4), (15,2), (16,0), (13,6), (11,9), (14,6), (12,8), (18,1), (13,8), (17,3), (11,10), (16,3), (16,5), (17,1), and (15,5).

When semiconducting carbon nanotubes having any of the above chiralities are included, the first wavelength of the semiconducting carbon nanotubes is equal to or longer than 1500 nm and equal to or shorter than 1800 nm.

For example, the first material may have an energy gap equal to or larger than 3.1 eV.

In this case, the first material absorbs light in a wavelength range shorter than the visible range and does not absorb light in the visible range. Therefore, the photoelectric conversion element obtained allows visible light to pass therethrough.

For example, the first material may contain at least one selected from the group consisting of $TiO_2$, ZnO, AlZnO (AZO), InGaZnO (IGZO), $In_2O_3$, $SnO_2$, $Ta_2O_5$, NTCDA, TCNQ, and TCNNQ.

In this case, an energy offset effective for charge separation of excitons generated in the semi-SWCNTs is formed at the heterointerface between the first material and the semi-SWCNTs, and therefore the efficiency of charge separation, i.e., the efficiency of photoelectric conversion, can be increased.

For example, the first material may be transparent to light in a wavelength range of 400 nm or longer and 650 nm or shorter, and the first material may have an energy gap equal to or smaller than 3.1 eV.

In this case, although the energy gap of the first material is equal to or smaller than 3.1 eV, the first material is transparent to light in the wavelength range of 400 nm or longer and 650 nm or shorter. Therefore, the photoelectric conversion element obtained allows visible light in the wavelength range of 400 nm or longer and 650 nm or shorter to pass therethrough.

For example, the first material may contain at least one selected from the group consisting of BT-CIC and $CO_t8DFIC$.

In this case, an energy offset effective for charge separation of excitons generated in the semi-SWCNTs is formed at the heterointerface between the first material and the semi-SWCNTs, and therefore the efficiency of charge separation, i.e., the efficiency of photoelectric conversion, can be increased.

For example, the semiconducting carbon nanotubes may have a uniform diameter.

In this case, the photoelectric conversion layer contains the semiconducting carbon nanotubes with a uniform diameter and therefore has absorption peaks in narrow wavelength bands at the first, second, and third wavelengths. In this case, the photoelectric conversion layer has sensitivity in wavelength ranges including these wavelengths and allows light in the first and second wavelength ranges to pass therethrough.

An electronic device according to another aspect of the present disclosure includes: a first photoelectric conversion element including the above-described photoelectric conversion element; and a second photoelectric conversion element that receives light that has passed through the first photoelectric conversion element.

In this electronic device, the second photoelectric conversion element can perform photoelectric conversion on the light that has passed through the first photoelectric conversion element. Therefore, the electronic device obtained can utilize light in two different wavelength ranges. Moreover, since the first photoelectric conversion element and the second photoelectric conversion element can be disposed on the same incident optical axis, the electronic device can be reduced in size.

For example, the first photoelectric conversion element may generate a first signal corresponding to light with at least one wavelength selected from the group consisting of the first wavelength, the second wavelength, and the third wavelength, and the second photoelectric conversion element may generate a second signal corresponding to light that has passed through the first photoelectric conversion element and that is in at least one wavelength range selected from the group consisting of the first wavelength range and the second wavelength range.

In this case, the electronic device obtained can generate signals corresponding to two different wavelength ranges using the first photoelectric conversion element and the second photoelectric conversion element. Since the first photoelectric conversion element and the second photoelectric conversion element can be disposed on the same incident optical axis, the electronic device can be reduced in size.

For example, the first photoelectric conversion element may absorb light with at least one wavelength selected from the group consisting of the first wavelength, the second wavelength, and the third wavelength to generate electric power, and the second photoelectric conversion element may generate a signal corresponding to light that has passed through the first photoelectric conversion element and that is in at least one wavelength range selected from the group consisting of the first wavelength range and the second wavelength range.

In this case, the electric power generated by the first photoelectric conversion element can be used for at least part of electric power for driving an imaging device, a photosensor, etc. including the second photoelectric conversion element. Therefore, the electronic device obtained is a power-saving device. Since the first photoelectric conversion element and the second photoelectric conversion element can be disposed on the same incident optical axis, the electronic device can be reduced in size.

For example, the first photoelectric conversion element may generate a signal corresponding to light with at least one wavelength selected from the group consisting of the first wavelength, the second wavelength, and the third wavelength, and the second photoelectric conversion element may absorb light that has passed through the first photoelectric conversion element and that is in at least one wavelength range selected from the group consisting of the first wavelength range and the second wavelength range to generate electric power.

In this case, the electric power generated by the second photoelectric conversion element can be used for at least part of electric power for driving an imaging device, a photosensor, etc. including the first photoelectric conversion element. Therefore, the electronic device obtained is a power-saving device. Since the first photoelectric conversion element and the second photoelectric conversion element can be disposed on the same incident optical axis, the electronic device can be reduced in size.

A light-emitting device according to another aspect of the present disclosure includes: a light-emitting element; and the above-described photoelectric conversion element disposed above a light-emitting surface of the light-emitting element. The light-emitting element emits light in at least one wavelength range selected from the group consisting of the first wavelength range and the second wavelength range, and the photoelectric conversion element absorbs light with at least one wavelength selected from the group consisting of the first wavelength, the second wavelength, and the third wavelength to generate electric power or generates a signal corresponding to light with at least one wavelength selected from the group consisting of the first wavelength, the second wavelength, and the third wavelength.

When the photoelectric conversion element functions as part of an image sensor, a photosensor, etc., the brightness of a lighting fixture including the light-emitting element can be controlled according to the results of detection of an object, or the contents displayed on a display including the light-emitting element may be changed according to the detection results. When the photoelectric conversion element functions as part of a solar cell, the electric power generated by the photoelectric conversion element can be used for at least part of the electric power consumed by a light-emitting module including the light-emitting element. Therefore, the light-emitting device obtained is a power-saving device.

Even when the photoelectric conversion element is disposed on the optical axis of the light emitted from the light-emitting element, light in at least one of the first and second first wavelength ranges emitted from the light-emitting element passes through the photoelectric conversion element, so that the function of the light-emitting device is not impaired. Since the photoelectric conversion element can be disposed on the optical axis of the light emitted from the light-emitting element, the light-emitting device can be reduced in size.

Some embodiments of the present disclosure will be described with reference to the drawings. However, these embodiments do not limit the scope or the present disclosure but are provided for illustrative purposes only.

The embodiments described below show general or specific examples. Numerical values, shapes, materials, components, arrangements and connections of the components, steps, the order of the steps, etc. shown in the following embodiments are merely examples and are not intended to limit the present disclosure. Among the components in the following embodiments, components not described in an independent claim will be described as optional components.

In the present specification, elements that are essential for the operations of the photoelectric conversion element, the electronic device, and the light-emitting device or effective in improving the characteristics thereof but are unnecessary for the description of the present disclosure are omitted. The drawings are schematic drawings, and scales, shapes, etc. are not taken into consideration at all. Therefore, the scales, for example, of the drawings are not necessarily the same. In the drawings, the same reference numerals are given to substantially the same components, and redundant description thereof will be omitted or simplified.

In the present specification, terms, such as equal, representing the relation between elements, terms, such as square and circular, representing the shapes of elements, and numerical ranges do not represent only their strict meanings but are intended to include those in substantially the same range, e.g., with a few percent difference.

In the present specification, the terms "above" and "below" do not refer to an upward direction (vertically above) and a downward direction (vertically below) in space recognition in an absolute manner but are used to define relative positional relations based on the stacking order in a stack structure. The terms "above" and "below" are used not only when two components are disposed with a space therebetween and another component is present between the two components but also when the two components are disposed in contact with each other.

Embodiment 1

[Overall Structure of Photoelectric Conversion Element]

Figure 3A:
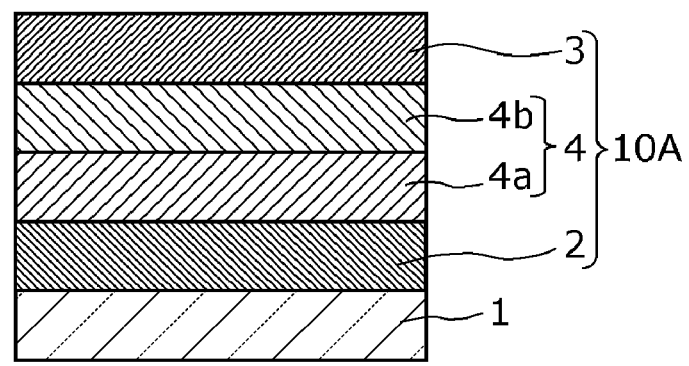
FIG. 3A is a cross-sectional view schematically showing an example of the structure of a photoelectric conversion element according to embodiment 1.
Figure 3B:
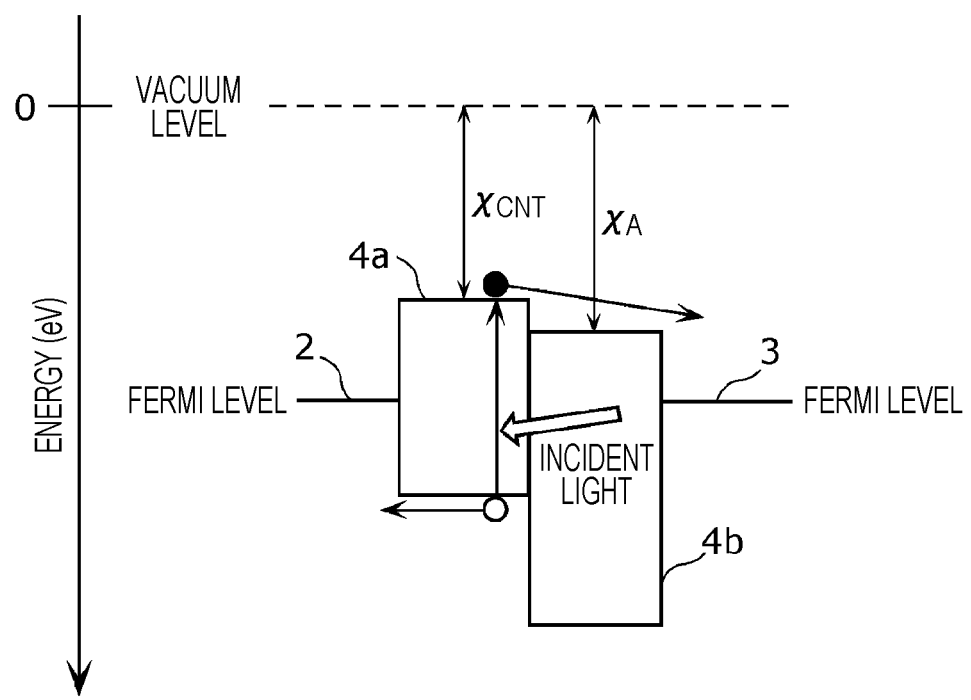
FIG. 3B shows an example of the energy diagram of the photoelectric conversion element shown in FIG. 3A.

First, the overall structure of a photoelectric conversion element according to an embodiment will be described. FIG. 3A is a cross-sectional view schematically showing the structure of the photoelectric conversion element 10A according to the present embodiment. FIG. 3B is an example of the energy diagram of the photoelectric conversion element 10A shown in FIG. 3A. As shown in FIG. 3A, the photoelectric conversion element 10A includes: a pair of electrodes including a lower electrode 2 and an upper electrode 3; and a photoelectric conversion layer 4 disposed between the lower electrode 2 and the upper electrode 3. The photoelectric conversion layer 4 includes: a carbon nanotube layer 4a containing semi-SWCNTs having a uniform diameter; and an acceptor layer 4b that is located between the carbon nanotube layer 4a and the upper electrode 3 and contains an electron acceptor material that functions as an acceptor for the semi-SWCNTs. Specifically, the photoelectric conversion layer 4 contains the semi-SWCNTs having a uniform diameter and the electron acceptor material that functions as an acceptor for the semi-SWCNTs. In the present specification, the semi-SWCNTs are an example of the semiconducting carbon nanotubes, and the electron acceptor material is an example of the first material. The lower electrode 2 is an example of the first electrode, and the upper electrode 3 is an example of the second electrode. In the following description, "the semi-SWCNTs having a uniform diameter" may be referred to as "uniform diameter semi-SWCNTs."

The photoelectric conversion element 10A is supported by a substrate 1. In the photoelectric conversion element 10A, the lower electrode 2, the carbon nanotube layer 4a serving as a donor layer and containing the semi-SWCNTs having a uniform diameter limited to a specific value, the acceptor layer 4b, and the upper electrode 3 are stacked in this order on a surface of the substrate 1.

Figure 4A:
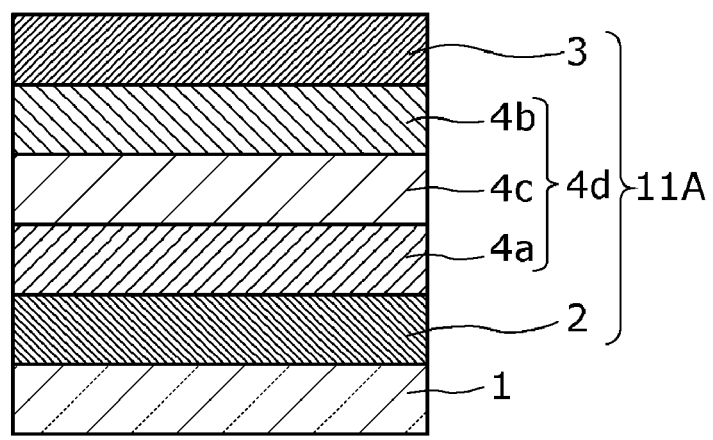
FIG. 4A is a cross-sectional view schematically showing another example of the structure of the photoelectric conversion element according to embodiment 1.
Figure 4B:
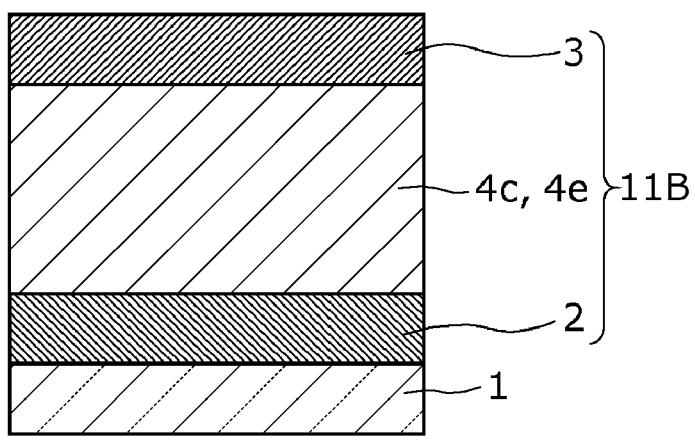
FIG. 4B is a cross-sectional view schematically showing still another example of the structure of the photoelectric conversion element according to embodiment 1.

FIGS. 4A and 4B are cross-sectional views schematically showing other examples of the structure of the photoelectric conversion element according to the present embodiment. As shown in FIG. 4A, a photoelectric conversion element 11A may include a photoelectric conversion layer 4d instead of the photoelectric conversion layer 4 of the photoelectric conversion element 10A. The photoelectric conversion layer 4d includes the carbon nanotube layer 4a, the acceptor layer 4b, and a mixture layer 4c located between the carbon nanotube layer 4a and the acceptor layer 4b and containing semi-SWCNTs having a uniform diameter and the electron acceptor material. With the photoelectric conversion layer 4d having the above-described structure, a large number of heterointerfaces at which the semi-SWCNTs having a uniform diameter are in contact with the electron acceptor material are formed in the mixture layer 4c, so that the area of the heterointerfaces in the photoelectric conversion layer 4d can be increased. Therefore, the photoelectric conversion efficiency of the photoelectric conversion element 11A increases. Moreover, as shown in FIG. 4B, a photoelectric conversion element 11B may include a photoelectric conversion layer 4e instead of the photoelectric conversion layer 4 of the photoelectric conversion element 10A. The photoelectric conversion layer 4e includes the mixture layer 4c. With the photoelectric conversion layer 4e having the above-described structure, the area of the heterointerfaces in the photoelectric conversion layer 4e can be maximized. Therefore, the photoelectric conversion efficiency of the photoelectric conversion element 11B can be further increased.

[Substrate]

The substrate 1 is a supporting substrate that supports the photoelectric conversion element 10A. No particular limitation is imposed on the material of the substrate 1, and any material highly transparent to light with a desired wavelength in, for example, the first wavelength range or the second wavelength range and having high electric conductivity can be used. In the present specification, the phrase "highly transparent to the desired wavelength" means that the light transmittance at the desired wavelength is equal to or higher than 50%. From the viewpoint of visibility and utilization of transmitted light when the photoelectric conversion element 10A is used as part of, for example, a window, the light transmittance of the high electric conductivity material may be equal to or higher than 70%. The material of the substrate 1 may be transparent to light in at least one of the first wavelength range and the second wavelength range. For example, when the substrate 1 allows light in the visible range to pass therethrough, the material of the substrate 1 may be a glass or plastic substrate coated with an electrically conductive metal oxide such as ITO (Indium Tin Oxide) or an electrically conductive polymer such as a composite (PEDOT/PSS) composed of poly(3,4-ethylenedioxythiophene) and polystyrene sulfonate. When the lower electrode 2 is connected to the outside through a plug, a wiring line, etc., the substrate 1 may not have electric conductivity.

[Lower Electrode and Upper Electrode]

The lower electrode 2 and the upper electrode 3 are transparent electrodes having high light transmittance at a desired wavelength. A bias voltage is applied to the lower electrode 2 and the upper electrode 3 through, for example, wiring lines (not shown). For example, the polarity of the bias voltage is determined such that electrons in electron-hole pairs generated in the photoelectric conversion layer 4 move to the upper electrode 3 and holes move to the lower electrode 2. The bias voltage may be set such that the holes in the electron-hole pairs generated in the photoelectric conversion layer 4 move to the upper electrode 3 and the electrons move to the lower electrode 2.

The material of the lower electrode 2 and the upper electrode 3 may be transparent to light in at least one of the first and second wavelength ranges. For example, a transparent conducting oxide (TCO) having a small resistance value may be used as the material of the lower electrode 2 and the upper electrode 3. No particular limitation is imposed on the TCO, and the TCO used may be, for example, ITO (Indium Tin Oxide), IZO (InZnO: Indium Zinc Oxide), AZO (AlZnO: Aluminum Zinc Oxide), FTO (Florine-doped Tin Oxide), $SnO_2$, $TiO_2$, or $ZnO_2$.

[Carbon Nanotube Layer]

The carbon nanotube layer 4a is a layer containing the semi-SWCNTs having a uniform diameter. For example, all the semi-SWCNTs contained in the carbon nanotube layer 4a may have a uniform diameter and include substantially no semi-SWCNTs other than the uniform diameter semi-SWCNTs. If the carbon nanotube layer 4a contains, as the semi-SWCNTs, a mixture of semi-SWCNTs having different diameters, absorption peaks appear at different wavelengths, so that the optical transparency in the desired wavelength ranges may be insufficient.

Figure 5A:
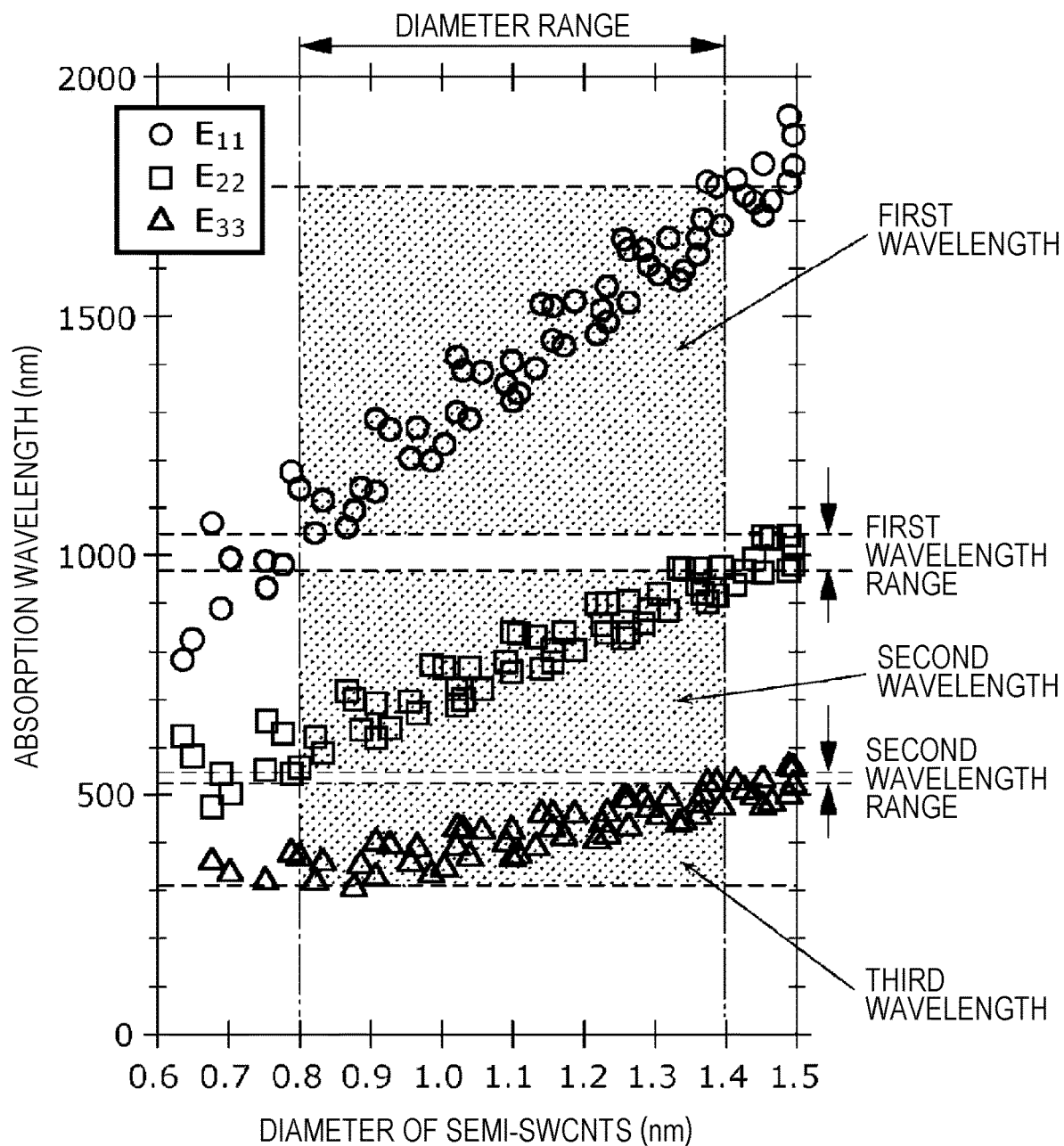
FIG. 5A is a graph showing a first wavelength range and a second wavelength range when the diameter range of the semi-SWCNTs is 1.1 nm±0.3 nm.

FIG. 5A is a graph showing the first wavelength range and the second wavelength range when the diameter range of the semi-SWCNTs is 1.1 nm±0.3 nm. FIG. 5B is a graph showing the first wavelength range and the second wavelength range when the diameter range of the semi-SWCNTs is 1.1 nm±0.1 nm. For example, as shown in FIG. 5A, when the carbon nanotube layer is formed from semi-SWCNTs having various diameters in the diameter range of 1.1 nm±0.3 nm, the first wavelength, the second wavelength, and the third wavelength each include absorption peaks in a corresponding dotted and hatched absorption wavelength range, and the first wavelength range and the second wavelength range each have a wavelength band width equal to or less than 100 nm. Therefore, the carbon nanotube layer has optical transparency only in limited wavelength ranges and is considered as substantially opaque although the first wavelength range and the second wavelength range are present. However, when the diameter distribution of the semi-SWCNTs forming the carbon nanotube layer 4a is limited to the diameter range of 1.1 nm±0.1 nm as shown in FIG. 5B, the width of each of the first wavelength range and the second wavelength range in which the optical transparency is high is as high as 200 nm or more.

Therefore, the semi-SWCNTs in the carbon nanotube layer 4a in the present embodiment are composed of semi-SWCNTs having a uniform diameter so that high optical transparency is obtained at desired wavelengths. The diameter of the semi-SWCNTs is determined by their chirality. Therefore, when the semi-SWCNTs have the same chirality, the semi-SWCNTs have a uniform diameter. In the present specification, the semi-SWCNTs having a uniform diameter mean that the diameters of the semi-SWCNTs are within their average diameter ±10%.

Generally, as-synthesized semi-SWCNTs include semi-SWCNTs with different chiralities, and their optical transparency at desired wavelengths is not sufficient. However, it is known that certain types of polymers are wrapped selectively around semi-SWCNTs with specific chiralities and well-dispersed in a solvent. Therefore, for example, a polythiophene-based or polyfluorene-based polymer and semi-SWCNTs with different chiralities are subjected to ultrasonic treatment in a solvent. Then the semi-SWCNTs wrapped with the polymer are separated by centrifugation, and a dispersion containing semi-SWCNTs with only a specific chirality, i.e., having a uniform diameter, is obtained. The obtained dispersion is used to form a film using spin coating or dip coating, and the carbon nanotube layer 4a having high optical transparency in a specific wavelength range can thereby be formed.

In addition to the separation method using a polymer, the following methods, for example, can be used to obtain semi-SWCNTs having a uniform diameter: (a) a method for selectively growing semi-SWCNTs with only a specific chirality by changing the type of catalyst for synthesis, synthesis conditions, etc., and (b) a method in which carbon nanorings serving as the shortest structure of carbon nanotubes are used as a template to precisely synthesize semi-SWCNTs with a specific chirality. Semi-SWCNTs obtained by any of the various methods and having a specific chirality may be used for the carbon nanotube layer 4a without additional treatment. Higher-purity semi-SWCNTs having only one chirality obtained by combining any of the above methods may be used for the carbon nanotube layer 4a.

As shown in FIG. 1B, the semi-SWCNTs having a uniform diameter have such light absorption characteristics that they have the first absorption peak at the first wavelength, the second absorption peak at the second wavelength, and the third absorption peak at the third wavelength in this order from the long wavelength side. The first absorption peak, the second absorption peak, and the third absorption peak are absorption peaks corresponding to the optical transition energies $E_{11}$, $E_{22}$, and $E_{33}$, respectively. The half widths of the first absorption peak, the second absorption peak, and the third absorption peak are small. Therefore, the photoelectric conversion element 10A obtained has sensitivity in narrow wavelength bands.

The first wavelength may be equal to or longer than 1300 nm and equal to or shorter than 1600 nm. In the wavelength range of 1300 nm or longer and 1600 nm or shorter, the intensity of sunlight is largely attenuated, and the sunlight in this wavelength range is lacking on the surface of the earth. Therefore, when the photoelectric conversion element 10A is used for an imaging device, images with the same quality can be captured at both day and night without being affected by sunlight by directing light in the above wavelength range to an object separately. In particular, in the wavelength range of 1350 nm or longer and 1450 nm or shorter, the attenuation of sunlight is larger on the surface of the earth, and therefore images less influenced by sunlight can be obtained. A wavelength longer than 1400 nm is called an eye safe wavelength, and its threshold for eye troubles is high, i.e., its maximum allowable exposure is high. Therefore, light in the above wavelength range is safer than light in other wavelength bands. For example, when the photoelectric conversion element 10A including the photoelectric conversion layer 4 containing semi-SWCNTs having a uniform diameter and having the first wavelength at 1550 nm is used for an imaging device in an environment in which humans are present, a laser or an LED (Light Emitting Diode) that emits light having the above wavelength at a higher power than that in other wavelength bands can be used to irradiate an object. Therefore, the imaging device can capture brighter images.

The diameter of semi-SWCNTs that gives a first wavelength equal to or longer than 1300 nm and equal to or shorter than 1600 nm is in the range of about 1 nm or longer and about 1.4 nm or shorter. A specific chirality of semi-SWCNTs that gives a first wavelength equal to or longer than 1300 nm and equal to or shorter than 1600 nm is selected from (8,7), (14,0), (13,2), (9,7), (11,4), (12,2), (12,4), (10,6), (13,0), (11,6), (9,8), (15,1), (14,3), (10,8), (13,3), (14,1), (13,5), (12,5), (11,7), (17,0), (12,7), (16,2), and (10,9).

[Acceptor Layer]

The acceptor layer 4b is a layer for dissociating excitons, i.e., electron-hole pairs, generated in the semi-SWCNTs into electrons and holes efficiently. Specifically, the acceptor layer 4b is a layer that receives the electrons at the heterointerface with the carbon nanotube layer 4a. The acceptor layer 4b contains, for example, an electron acceptor material that has a high ability to accept electrons from the semi-SWCNTs, i.e., functions as an acceptor. In other words, as shown in FIG. 3B, the electron affinity $\chi_A$ of the acceptor layer 4b is equal to or larger than, for example, the electron affinity $\chi_{CNT}$ of the carbon nanotube layer 4a. The electron affinity is the difference between the vacuum level and the energy level of the lowest unoccupied molecular orbital (LUMO) or the lower edge of the conduction band. When the acceptor layer 4b is formed from an electron acceptor material and the carbon nanotube layer 4a is formed from semi-SWCNTs, the electron affinity $\chi_A$ is the electron affinity of the electron acceptor material, and the electron affinity $\chi_{CNT}$ is the electron affinity of the semi-SWCNTs. According to "Empirical Prediction of Electronic Potentials of Single-Walled Carbon Nanotubes With a Specific Chirality (n, m)," Y. Hirana et al., Scientific Reports, Vol. 3, p 2959, 2013 (Non Patent Literature 2), the LUMO level of semi-SWCNTs depends on their diameter, and the depth of the LUMO energy level with respect to the vacuum level increases as the diameter increases. Therefore, the electron acceptor material is selected such that a suitable LUMO energy level is obtained according to the chirality corresponding to the diameter of the semi-SWCNTs used. For example, when the semi-SWCNTs have a diameter of about 1 nm and are transparent in the visible range, the electron affinity $\chi_{CNT}$ is about 4 eV. In this case, a material having an electron affinity $\chi_A$ equal to or larger than 4 eV is selected as the electron acceptor material. The acceptor layer 4b is formed, for example, by using any of various methods such as spin coating using a dispersion containing the electron acceptor material or vapor deposition of the acceptor material.

The electron acceptor material is transparent to light in at least one of the first wavelength range between the first wavelength and the second wavelength and the second wavelength range between the second wavelength and the third wavelength. In this case, the photoelectric conversion element 10A obtained is transparent to light in at least one of the first wavelength range and the second wavelength range. Moreover, the photoelectric conversion element 10A obtained does not have sensitivity to light in at least one of the first wavelength range and the second wavelength range. In the present specification, a material transparent to light in a certain wavelength range means that the light transmittance of a film of the material with a thickness equal to or less than 100 nm in the above wavelength range is equal to or more than 50% irrespective of the wavelength, so that the material substantially allows light to pass therethrough. From the viewpoint of visibility and utilization of transmitted light when the photoelectric conversion element 10A is used as part of, for example, a window, the light transmittance of a film of the electron acceptor material with a thickness equal to or less than 100 nm in the above wavelength range may be equal to or higher than 70%. Moreover, the light transmittance of a film of the electron acceptor material in the above wavelength range may be equal to or higher than 50% or equal to or higher than 70% irrespective of the thickness of the film.

When the acceptor layer 4b contains a material other than the electron acceptor material, the material other than the electron acceptor material is transparent to, for example, light in at least one of the first wavelength range and the second wavelength range.

The second wavelength range may include the wavelength range of 400 nm or longer and 650 nm or shorter. In this case, when the electron acceptor material is transparent to light in the wavelength range of 400 nm or longer and 650 nm or shorter, the photoelectric conversion element 10A obtained is transparent in the visible range including the wavelength range of 400 nm or longer and 650 nm or shorter.

For example, when the semi-SWCNTs have a diameter of about 1 nm and are transparent in the visible range, i.e., their first or second wavelength range includes the visible range, a material having an energy gap equal to or larger than 3.1 eV is selected as the electron acceptor material so that it has a high transmittance in the visible range. The energy gap is the difference between the LUMO energy level or the energy level of the lower edge of the conduction band and the energy level of the highest occupied molecular orbital (HOMO) or the upper edge of the valence band.

The electron acceptor material transparent to visible light is, for example, a semiconductor material that does not exhibit absorption of light with a wavelength equal to or longer than 400 nm, i.e., whose energy gap correlated with the absorption edge is equal to or larger than 3.1 eV. Specifically, the energy gap of the electron acceptor material may be equal to or larger than 3.1 eV. Moreover, for example, the electron acceptor material transparent to visible light may be a semiconductor material that has an energy gap equal to or lower than 3.1 eV so long as it is transparent to light in the wavelength range of 400 nm or longer and 650 nm or shorter and can be regarded as substantially transparent. Specifically, the electron acceptor material is transparent to light in the wavelength range of 400 nm or longer and 650 nm or shorter, and the energy gap of the electron acceptor material may be equal to or lower than 3.1 eV.

Specific examples of the electron acceptor material having an energy gap equal to or larger than 3.1 eV include: oxide semiconductors such as $TiO_2$, ZnO, AZO, IGZO (InGaZnO: Indium Gallium Zinc Oxide), $In_2O_3$, $SnO_2$ and $Ta_2O_5$; and wide gap n-type organic semiconductors such as NTCDA (Naphthalene-1,4,5,8-TetraCarboxylic DiAnhydride), TCNQ (7,7,8,8-TetraCyalloQuinodimethane), and TCNNQ (11,11,12,12-TetraCyaNoNaphtho-2,6-Quinodimethane).

Specific examples of the electron acceptor material transparent to light in the wavelength range of 400 nm or longer and 650 nm or shorter even when the energy gap is equal to or lower than 3.1 eV include non-fullerene-based low-bandgap organic semiconductors such as BT-CIC represented by the following structural formula (1) and $CO_t8DFIC$ represented by the following formula (2).

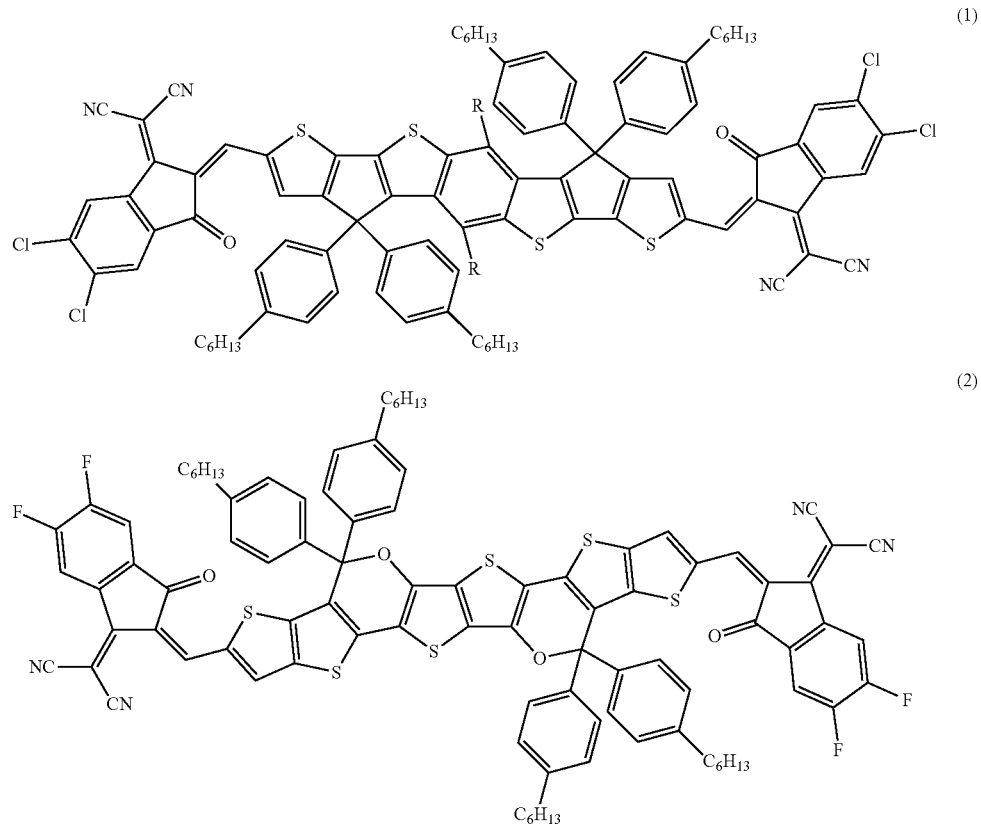

Figure 6:
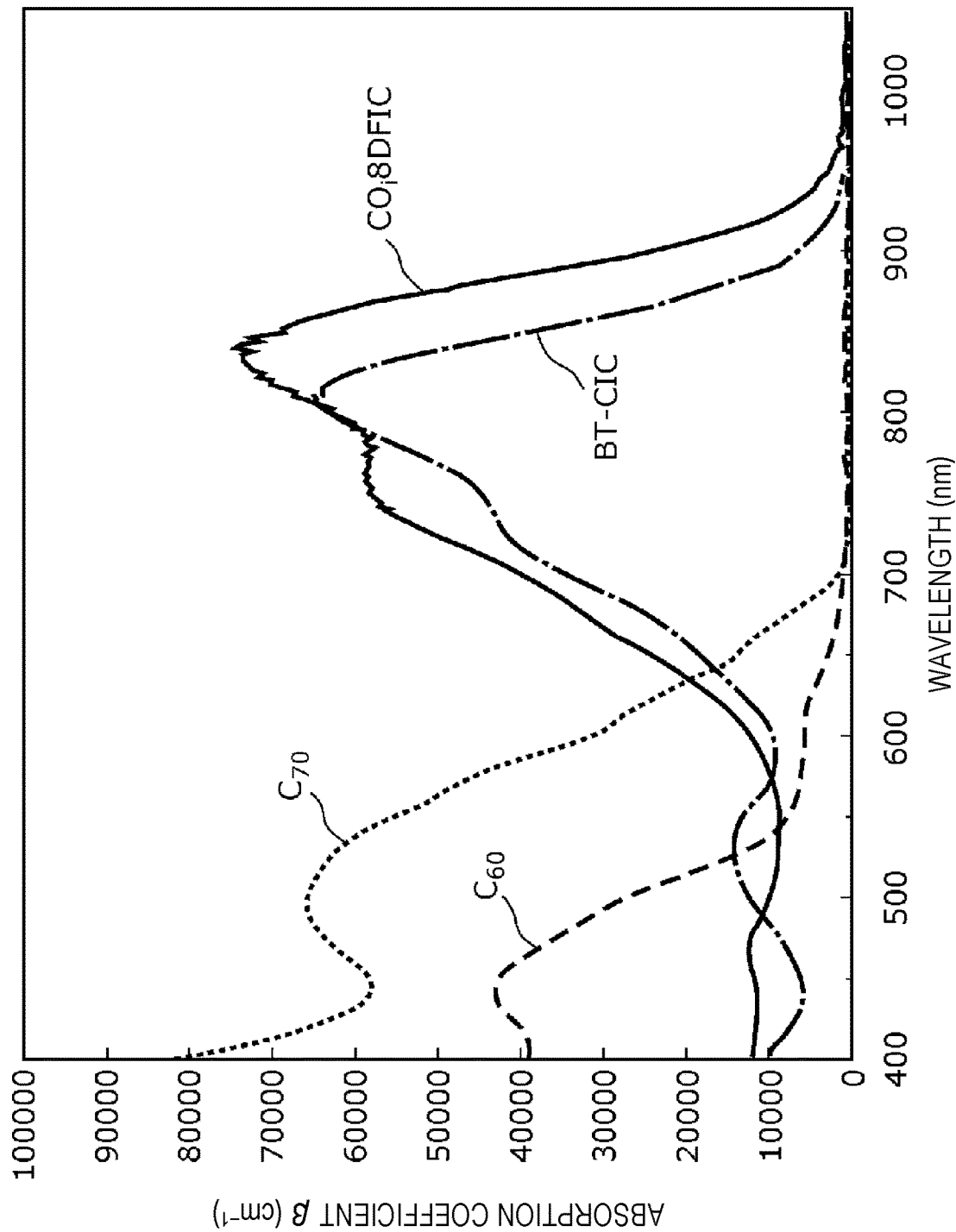
FIG. 6 is a graph showing the absorption spectra of various organic semiconductors.

FIG. 6 is a graph showing the absorption spectra of various organic semiconductors. FIG. 6 shows the absorption spectra of $C_{60}$ fullerene, $C_{70}$ fullerene, BT-CIC, and $CO_t 8DFIC$. As shown in FIG. 6, the absorption coefficients of BT-CIC and $CO_t 8DFIC$ for light in the wavelength range of 400 nm or longer and 650 nm or shorter, which is the visible range, are lower than those of $C_{60}$ fullerene and $C_{70}$ fullerene and are generally flat even when the wavelength changes. Therefore, for example, even when BT-CIC or $CO_t 8DFIC$ is deposited to a film thickness of 100 nm to form the acceptor layer 4b, the light transmittance in the wavelength range of 400 nm or longer and 650 nm or shorter can be equal to or higher than 50% irrespective of the wavelength. When BT-CIC or $CO_t 8DFIC$ is used for the acceptor layer 4b, the photoelectric conversion element 10A obtained has low sensitivity to light in the wavelength range of 400 nm or longer and 650 nm or shorter. For example, when the photoelectric conversion element 10A is used for an imaging device for capturing images using near infrared light or infrared light, the imaging device obtained can capture images with less external perturbations even when the environmental light contains visible light.

When $C_{60}$ fullerene is used as the electron acceptor material of the acceptor layer and deposited to a film thickness of 100 nm, the light transmittance in the wavelength range of 400 nm or longer and 650 nm or shorter is reduced to 37% at a wavelength of 440 nm at which the light transmittance is lowest. Moreover, the absorption coefficient of $C_{60}$ fullerene increases as the wavelength decreases. Therefore, light passing through the acceptor layer assumes a yellow color and has a color temperature different from the color temperature of natural light. The absorption of light by $C_{60}$ fullerene causes generation of excitons, and therefore the photoelectric conversion element has large sensitivity to light in the wavelength range of 400 nm or longer and 650 nm or shorter, so that the photoelectric conversion element having no sensitivity to light in the visible wavelength range is not obtained. Therefore, when the photoelectric conversion element containing $C_{60}$ fullerene is used for an imaging device that captures images using near infrared light or infrared light, images with external perturbations are captured when the environmental light contains visible light. Therefore, this photoelectric conversion element cannot be used for an imaging device unless light in the wavelength range of 400 nm or longer and 650 nm or shorter is filtered out using, for example, a bandpass filter.

Figure 7:
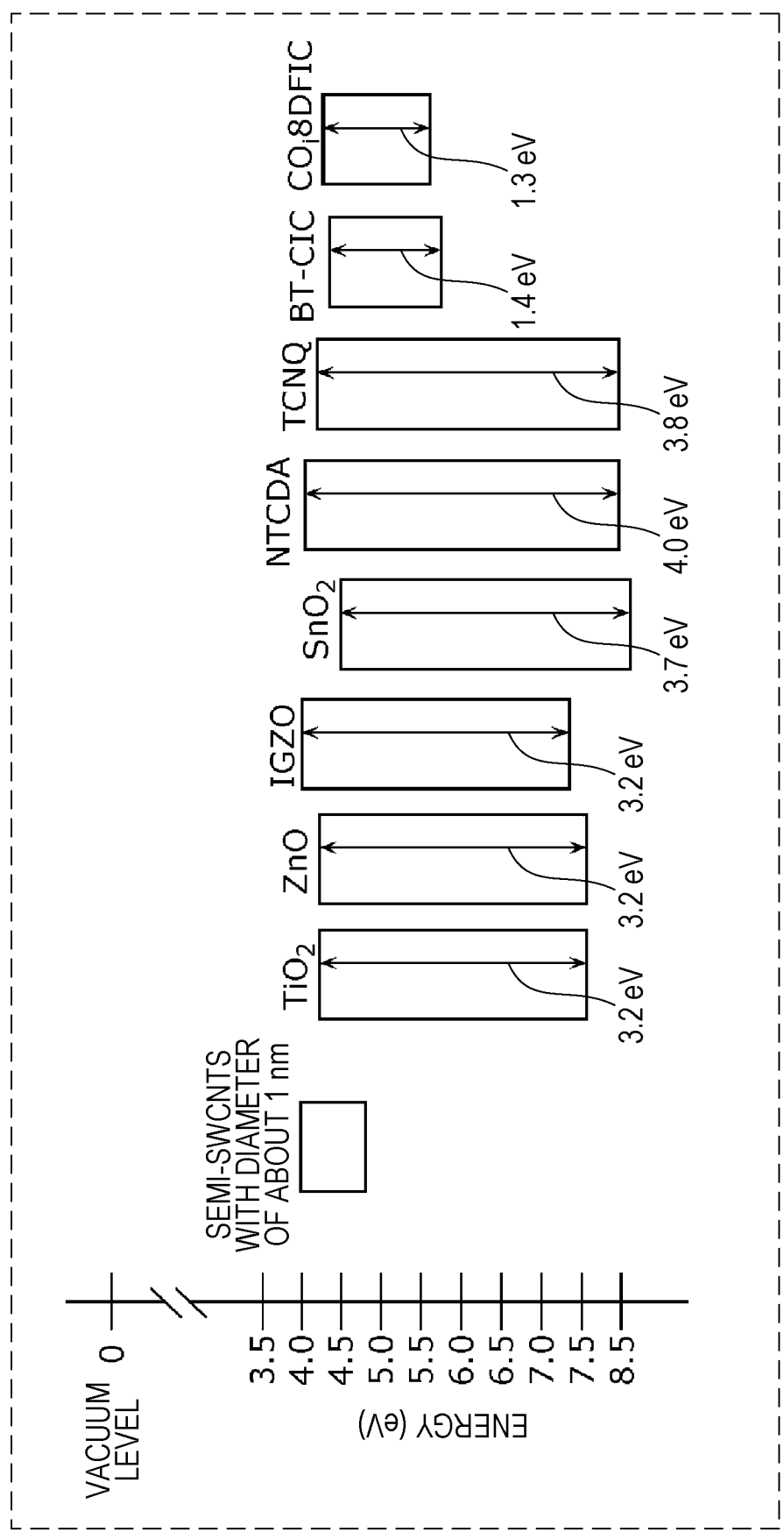
FIG. 7 is an energy diagram of electron acceptor materials usable for an acceptor layer in embodiment 1.

FIG. 7 is an energy diagram of electron acceptor materials usable for the acceptor layer 4b in the present embodiment. As shown in FIG. 7, the energy gaps of $TiO_2$, ZnO, IGZO, $SnO_2$, NTCDA, and TCNQ are equal to or larger than 3.1 eV, and their electron affinity is larger than that of semi-SWCNTs having a diameter of about 1 nm. Therefore, to allow the photoelectric conversion element 10A obtained to be transparent to visible light, $TiO_2$, ZnO, IGZO, $SnO_2$, NTCDA, and TCNQ are useful as the electron acceptor material. Although the energy gaps of BT-CIC and $CO_t 8DFIC$ are equal to or lower than 3.1 eV, they are transparent to light in the wavelength range of 400 nm or longer and 650 nm or shorter, and their electron affinity is larger than that of the semi-SWCNTs having a diameter of about 1 nm. Therefore, to allow the photoelectric conversion element 10A obtained to be transparent to visible light, BT-CIC and $CO_t 8DFIC$ are useful as the electron acceptor material.

As described above, when, for example, a combination of the semi-SWCNTs having a diameter of about 1 nm and an electron acceptor material transparent in the visible range is used as the material of the photoelectric conversion layer 4, a near infrared photoelectric conversion element that has high light transmittance in the visible range and is responsive to light having a wavelength equal to or longer than 1100 nm and equal to or shorter than 1400 nm that corresponds to the optical transition energy $E_{11}$ can be obtained.

By forming the photoelectric conversion layer 4 using the semi-SWCNTs having a uniform diameter and the electron acceptor material transparent to light in the wavelength range in which the semi-SWCNTs have transparency as described above, the photoelectric conversion element 10A obtained can perform photoelectric conversion on light having a certain wavelength and allows light in a specific wavelength range to selectively pass therethrough. Since the diameter of semi-SWCNTs is determined by their chirality, the semi-SWCNTs having a uniform diameter may be composed of semi-SWCNTs with chiralities corresponding to the desired uniform diameter or may be composed of semi-SWCNTs with a single chirality. Semi-SWCNTs with different chiralities have absorption peaks at different wavelengths in the absorption spectrum. However, when the semi-SWCNTs have a single chirality, they do not have such peaks, so that the absorption peak in the absorption spectrum can be narrowed. In addition, the light transmittance in the wavelength range in which the semi-SWCNTs allow light to pass therethrough can be improved.

The photoelectric conversion element 10A may include a donor layer instead of the acceptor layer 4b. The donor layer is a layer for dissociating excitons, i.e., electron-hole pairs, generated in the semi-SWCNTs into electrons and holes efficiently. Specifically, the donor layer is a layer that receives the holes at the heterointerface with the carbon nanotube layer 4a. The donor layer contains, for example, an electron donor material that has a high ability to donate electron to the semi-SWCNTs, i.e., functions as a donor. In other words, the ionization potential of the donor layer is equal to or lower than, for example, the ionization potential of the carbon nanotube layer 4a.

[Mixture Layer]

The mixture layer 4c is a layer containing the semi-SWCNTs having a uniform diameter and the electron acceptor material. The mixture layer 4c is formed, for example, by depositing a film by any of various methods such as spin coating using a dispersion containing the semi-SWCNTs having a uniform diameter and the electron acceptor material. The semi-SWCNTs having a uniform diameter and the electron acceptor material are as described above, and their description will be omitted.

[Another Example of Photoelectric Conversion Element]

Figure 8A:
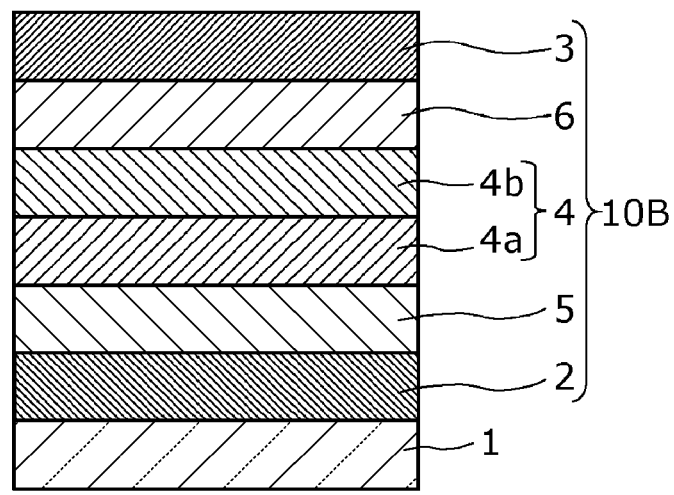
FIG. 8A is a cross-sectional view schematically showing yet another example of the structure of the photoelectric conversion element according to embodiment 1.
Figure 8B:
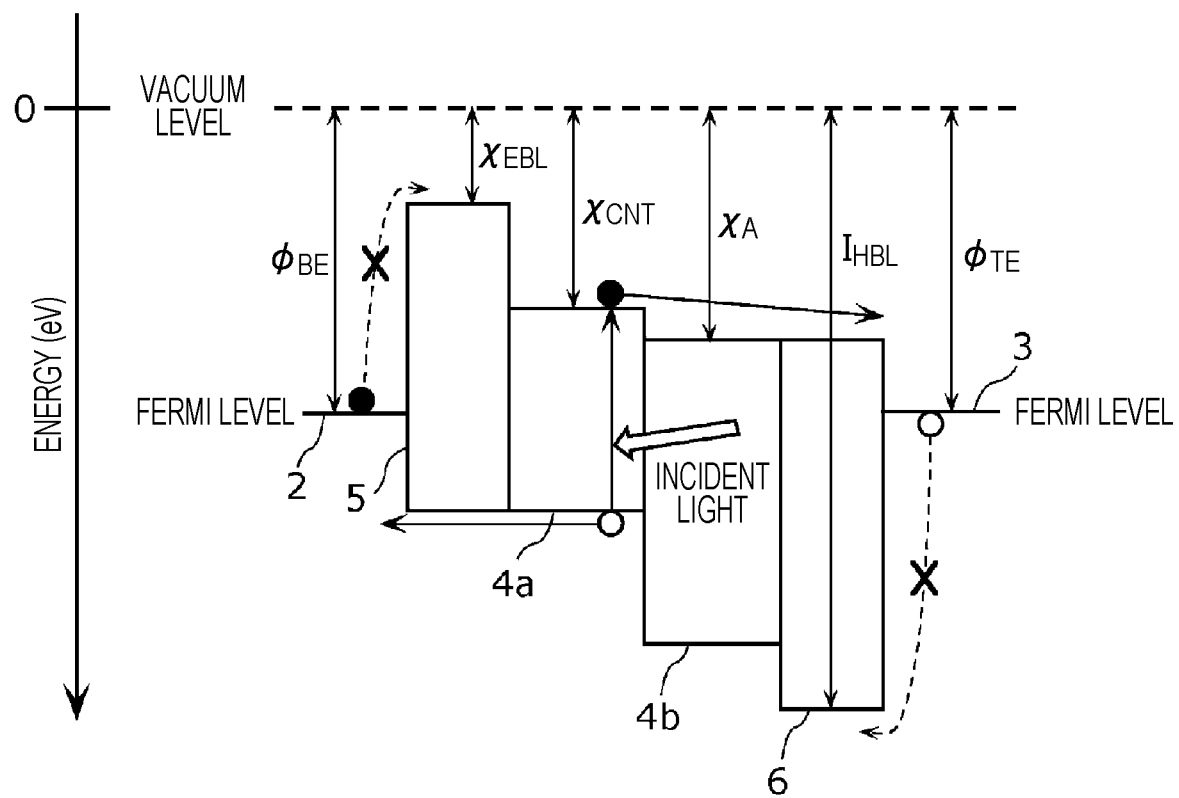
FIG. 8B shows an example of the energy diagram of the photoelectric conversion element shown in FIG. 8A.

Next, another example of the photoelectric conversion element according to the present embodiment will be described using FIGS. 8A and 8B. FIG. 8A is a cross-sectional view schematically showing the structure of a photoelectric conversion element 10B that is the other example of the photoelectric conversion element according to the present embodiment. FIG. 8B is an example of the energy diagram of the photoelectric conversion element 10B shown in FIG. 8A. In the photoelectric conversion element 10B shown in FIG. 8A, the same components as those in the photoelectric conversion element 10A shown in FIG. 3A are denoted by the same reference numerals, and redundant description thereof will be omitted or simplified.

As shown in FIG. 8A, the photoelectric conversion element 10B includes: the pair of electrodes including the lower electrode 2 and the upper electrode 3; the photoelectric conversion layer 4 located between the lower electrode 2 and the upper electrode 3; an electron blocking layer 5 located between the photoelectric conversion layer 4 and the lower electrode 2; and a hole blocking layer 6 located between the photoelectric conversion layer 4 and the upper electrode 3. In other words, the photoelectric conversion element 10B has a structure in which the lower electrode 2, the electron blocking layer 5, the carbon nanotube layer 4a, the acceptor layer 4b, the hole blocking layer 6, and the upper electrode 3 are stacked in this order on a surface of the substrate 1. In the structure of the photoelectric conversion element 10B, the holes generated in the photoelectric conversion layer 4 flow to the lower electrode 2, and the electrons flow to the upper electrode 3. The photoelectric conversion layer 4 may have a multilayer structure including the carbon nanotube layer 4a and the acceptor layer 4b, may further include the mixture layer between the carbon nanotube layer 4a and the acceptor layer 4b, or may include only the mixture layer.

The photoelectric conversion element according to the present embodiment may include the electron blocking layer 5 (EBL) between the lower electrode 2 and the carbon nanotube layer 4a to suppress a dark current, as in the photoelectric conversion element 10B. As shown in FIG. 8B, the electron blocking layer 5 is a layer serving as a barrier for injection of electrons from the lower electrode 2. To suppress a dark current due to electron injection from the lower electrode 2, the electron affinity $\chi_{EBL}$ of the electron blocking layer 5 is, for example, equal to or smaller than the electron affinity $\chi_{CNT}$ of the carbon nanotube layer 4a. For example, the upper limit of the ionization potential $I_{EBL}$ of the electron blocking layer 5 is 0.3 eV higher than the ionization potential $I_{CNT}$ of the carbon nanotube layer 4a, and the ionization potential $I_{EBL}$ is equal to or lower than the upper limit so as not to prevent transfer of holes from the carbon nanotube layer 4a to the lower electrode 2. The ionization potential is the difference between the vacuum level and the energy level of the highest occupied molecular orbital (HOMO) or the upper edge of the valence band.

For example, the material of the electron blocking layer 5 satisfies the above-described relation between the electron affinities and the above-described relation between the ionization potentials and is, for example, a p-type semiconductor. The material of the electron blocking layer 5 may be an organic material such as PEDOT/PSS or poly-TPD or a metal oxide such as NiO, CoO, $Co_3O_4$, $Cr_2O_3$, $Cu_2O$, or CuO. The material of the electron blocking layer 5 may be transparent to light in at least one of the first wavelength range and the second wavelength range.

Similarly, the photoelectric conversion element according to the present embodiment may include the hole blocking layer 6 (HBL) between the upper electrode 3 and the acceptor layer 4b, as in the photoelectric conversion element 10B. As shown in FIG. 8B, the hole blocking layer 6 is a layer serving as a barrier for injection of holes from the upper electrode 3. In this case, to suppress a dark current due to hole injection from the upper electrode 3, the ionization potential $I_{HBL}$ of the hole blocking layer 6 is, for example, equal to or larger than the ionization potential $I_A$ of the acceptor layer 4b. For example, in order not to prevent transfer of electrons from the acceptor layer 4b to the upper electrode 3, the electron affinity $\chi_{HBL}$ of the hole blocking layer 6 is equal to or larger than the electron affinity $\chi_A$ of the acceptor layer 4b. For example, the material of the hole blocking layer 6 satisfies the above-described relation between the electron affinities and the above-described relation between the ionization potentials and is, for example, an n-type semiconductor material. The material of the hole blocking layer 6 may be bathocuproine (BCP) or bathophenanthroline (BPhen). The material of the hole blocking layer 6 may be transparent to light in at least one of the first wavelength range and the second wavelength range.

The hole blocking layer 6 and the electron blocking layer 5 have electric conductivity in order to transport electrons and holes, respectively. Therefore, when the electron blocking layer 5 is disposed between the lower electrode 2 and the photoelectric conversion layer 4, the carbon nanotube layer 4a is in contact with the electron blocking layer 5 and is thereby electrically connected to the lower electrode 2 via the electron blocking layer 5.

To obtain a photoelectric conversion element in which the electrons generated in the photoelectric conversion layer 4 flow to the lower electrode 2 and the holes flow to the upper electrode 3, the positions of the electron blocking layer 5 and the hole blocking layer 6 in the photoelectric conversion element 10B are exchanged with each other. In this case, the photoelectric conversion element is configured such that the positions of the carbon nanotube layer 4a and the acceptor layer 4b are exchanged with each other. Alternatively, the photoelectric conversion element is configured to include a donor layer containing an electron donating material instead of the acceptor layer 4b.

The photoelectric conversion element 10B may include only one of the electron blocking layer 5 and the hole blocking layer 6. To obtain high transparency to light with a desired wavelength, the material of the electron blocking layer 5 and the material of the hole blocking layer 6 may each have an energy gap equal to or larger than 3.1 eV.

The electron blocking layer 5 and the hole blocking layer 6 may each be used as an electron acceptor for withdrawing electrons from the electron-hole pairs generated by light absorption in the semi-SWCNTs contained in the photoelectric conversion layer 4. When the electron blocking layer 5 and the hole blocking layer 6 are each used as an electron acceptor, the energy of the lower edge of the conduction band or the energy of the lowest unoccupied molecular orbital of each of the material of the electron blocking layer 5 and the material of the hole blocking layer 6 with respect to the vacuum level is, for example, equal to or larger than 4.0 eV. Alternatively, the electron blocking layer 5 and the hole blocking layer 6 may each be used as an electron donor for withdrawing holes from the electron-hole pairs generated by light absorption in the semi-SWCNTs contained in the photoelectric conversion layer 4. When the electron blocking layer 5 and the hole blocking layer 6 are each used as an electron donor, the energy of the upper edge of the valence band or the energy of the highest occupied molecular orbit of each of the material of the electron blocking layer 5 and the material of the hole blocking layer 6 with respect to the vacuum level is, for example, equal to or lower than 5.1 eV.

Embodiment 2

Next, embodiment 2 will be described. In embodiment 2, an imaging device including the photoelectric conversion element according to embodiment 1 will be described. In the imaging device according to embodiment 2, the same components as those in the photoelectric conversion element according to embodiment 1 are denoted by the same reference numerals, and redundant description thereof will be omitted or simplified.

[Overall Structure of Imaging Device]

Figure 9:
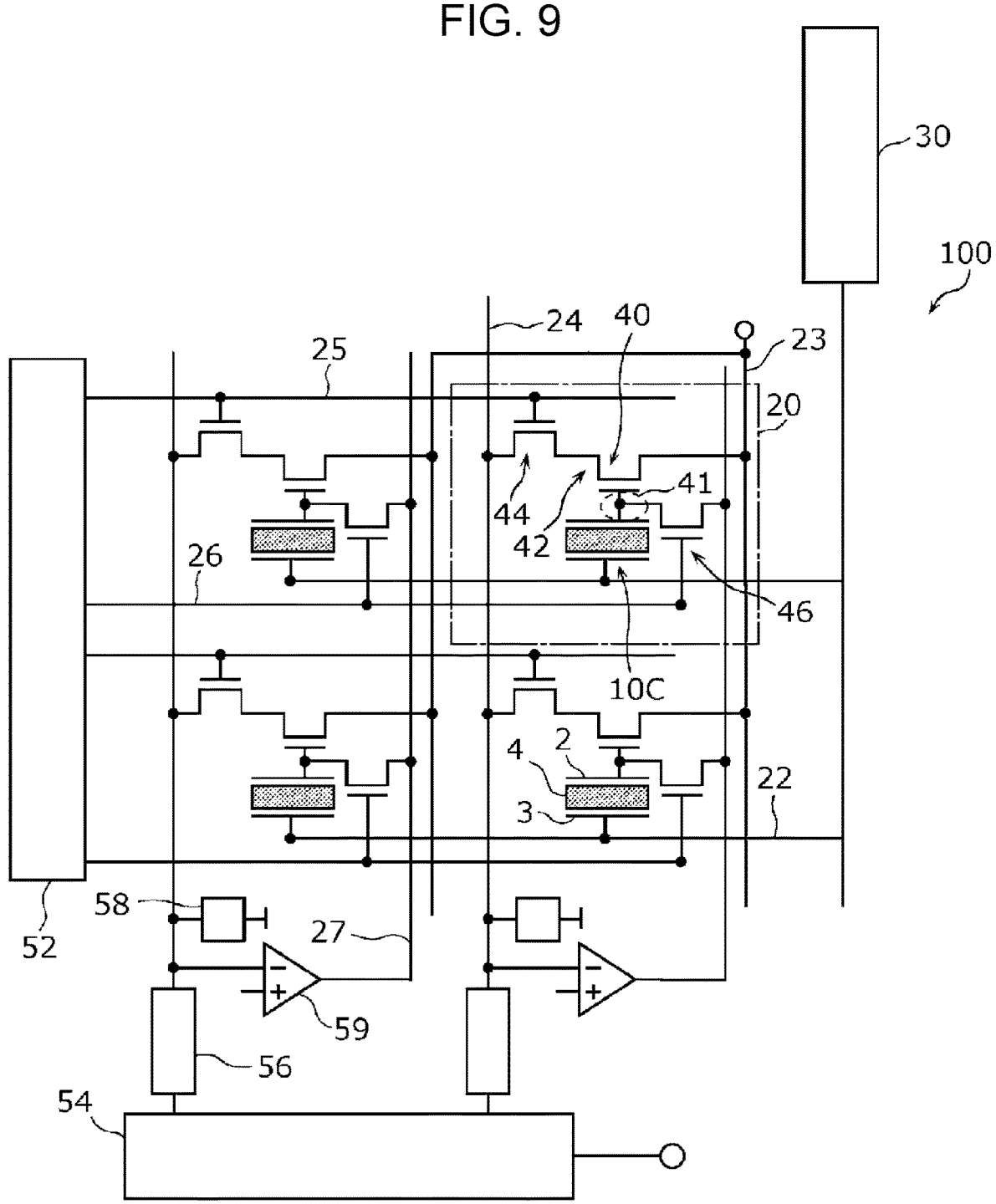
FIG. 9 is an illustration showing an example of the circuit structure of an imaging device according to embodiment 2.

First, the overall structure of the imaging device according to the present embodiment will be described. FIG. 9 is an illustration showing an example of the circuit structure of the imaging device 100 according to the present embodiment. The imaging device 100 shown in FIG. 9 includes pixels 20 and peripheral circuits. The peripheral circuits include a voltage supply circuit 30 for supplying a prescribed voltage to each of the pixels 20.

The pixels 20 are arranged one-dimensionally or two-dimensionally on a semiconductor substrate to form a photosensitive region, i.e., a pixel region. In the structure exemplified in FIG. 9, the pixels 20 are arranged in row and column directions. In the present specification, the row and column directions mean a direction along rows and a direction along columns, respectively. Specifically, the vertical direction in the drawing sheet of FIG. 9 is the column direction, and the horizontal direction is the row direction. Four pixels 20 arranged in a 2×2 matrix are shown in FIG. 9. The number of pixels 20 shown in FIG. 9 is merely an example for illustrative purposes, and the number of pixels 20 is not limited to four. When the pixels 20 are arranged one-dimensionally, the imaging device 100 is a line sensor.

Each of the pixels 20 includes a photoelectric converter 10C and a signal detection circuit 40 that detects a signal generated by the photoelectric converter 10C. The photoelectric converter 10C includes a lower electrode 2, an upper electrode 3, and a photoelectric conversion layer 4 disposed therebetween. The photoelectric converter 10C includes the photoelectric conversion element 10A or 10B in embodiment 1. The lower electrode 2 function as a charge collector. As shown in FIG. 9, each upper electrode 3 is connected to the voltage supply circuit 30 via an storage control line 22. During the operation of the imaging device 100, a prescribed bias voltage is applied to the upper electrodes 3 via the storage control lines 22. Each lower electrode 2 is referred to also as a pixel electrode, and each upper electrode 3 is referred to also as a counter electrode facing the pixel electrode.

As described above, the photoelectric conversion layer 4 contains semi-SWCNTs, and each photoelectric converter 10C is configured such that the lower electrode 2 collects, as signal charges, holes (i.e., positive charges) or electrons (i.e., negative charges) in electron-hole pairs generated by photoelectric conversion. The bias voltage generated by the voltage supply circuit 30 is used to control the potential of the upper electrodes 3, and the lower electrodes 2 can thereby collect the holes or the electrons. For example, when holes are used as the signal charges, a voltage of, for example, about 10 V is applied to the storage control lines 22 such that the potential of the upper electrodes 3 is higher than the potential of the lower electrodes 2.

In the structure exemplified in FIG. 9, each signal detection circuit 40 includes an amplification transistor 42, an address transistor 44, and a reset transistor 46. The amplification transistor 42 is referred to also as a charge detection transistor, and the address transistor 44 is referred to also as a row selection transistor. Typically, the amplification transistor 42 and the address transistor 44 are field effect transistors (FETs) formed on the semiconductor substrate. In the following description of the example, the transistors are N-channel MOSFETs (Metal Oxide Semiconductor Field Effect Transistors), unless otherwise specified. Each of the amplification transistor 42, the address transistor 44, and the reset transistor 46 has a control terminal, an input terminal, and an output terminal. The control terminal is, for example, the gate. The input terminal is one of the drain and the source and is typically the drain. The output terminal is one of the drain and the source and is typically the source.

The "semiconductor substrate" in the present specification is not limited to a substrate formed entirely of a semiconductor and may be, for example, an insulating substrate having a semiconductor layer disposed on the surface on the side on which the photosensitive region is to be formed. One example of the semiconductor substrate is a p-type silicon substrate.

As shown in FIG. 9, one of the input terminal and the output terminal of the amplification transistor 42 is connected to one of the input terminal and the output terminal of the address transistor 44. The control terminal of the amplification transistor 42 is electrically connected to the lower electrode 2 of the photoelectric converter 10C. The signal charges collected by the lower electrode 2 are stored in a charge storage node 41 between the lower electrode 2 and the gate of the amplification transistor 42. The signal charges are holes or electrons. The charge storage node 41 is an example of a charge storage unit and is referred to as a "floating diffusion node."

A voltage corresponding to the signal charges stored in the charge storage node 41 is applied to the gate of the amplification transistor 42. The amplification transistor 42 amplifies this voltage. Specifically, the amplification transistor 42 amplifies a signal generated by the photoelectric converter 10C. The voltage amplified by the amplification transistor 42 is selectively read as a signal voltage through the address transistor 44.

One of the source and the drain of the reset transistor 46 is connected to the charge storage node 41 and is electrically connected to the lower electrode 2.

The reset transistor 46 resets the signal charges stored in the charge storage node 41. In other words, the reset transistor 46 resets the potential of the gate of the amplification transistor 42 and the potential of the lower electrode 2.

As shown in FIG. 9, the imaging device 100 further includes power source lines 23, vertical signal lines 24, address signal lines 25, and reset signal lines 26. These lines are connected to the pixels 20. The power source lines 23 are connected to the sources or drains of the amplification transistors 42 and supply a prescribed power supply voltage to the pixels 20. The power source lines 23 function as a source follower power source. The vertical signal lines 24 are connected to the sources or drains of the address transistors 44 that are not connected to the sources or drains of the amplification transistors 42. The address signal lines 25 are connected to gate electrodes of the address transistors 44. The reset signal lines 26 are connected to the gates of the reset transistors 46.

The peripheral circuits of the imaging device 100 include a vertical scanning circuit 52, a horizontal signal reading circuit 54, column signal processing circuits 56, load circuits 58, and inverting amplifiers 59. The vertical scanning circuit 52 is referred to also as a "row scanning circuit," and the horizontal signal reading circuit 54 is referred to also as a "column scanning circuit." The column signal processing circuits 56 are referred to also as "column signal storage circuits." The column signal processing circuits 56, the load circuits 58, and the inverting amplifiers 59 are provided for the respective columns of the pixels 20 arranged in the row and column directions. Each column signal processing circuit 56 is electrically connected to pixels 20 disposed in a corresponding column through a corresponding one of the vertical signal lines 24 provided for the respective columns of pixels 20. The column signal processing circuits 56 are electrically connected to the horizontal signal reading circuit 54. The load circuits 58 are electrically connected to the respective vertical signal lines 24, and the load circuits 58 and the amplification transistors 42 form source follower circuits.

The vertical scanning circuit 52 is connected to the address signal lines 25 and the reset signal lines 26. The vertical scanning circuit 52 applies a row selection signal to the gates of the address transistors 44 through address signal lines 25, and the row selection signal is used to switch the address transistors 44 on and off. The row selection signal is sent to an address signal line 25 for a row to be read, and this row is selected and scanned. Signal voltages are read from pixels 20 in the selected row through the respective vertical signal lines 24. The vertical scanning circuit 52 applies a reset signal to the gates of the reset transistors 46 through the reset signal lines 26, and the reset signal is used to switch the reset transistors 46 on and off. The reset signal is sent to a reset signal line 26 for a row including pixels 20 to be subjected to a reset operation, and this row is thereby selected. In this manner, the vertical scanning circuit 52 selects pixels 20 in a single row, reads signal voltages from the selected pixels 20, and resets the potential of each of the lower electrodes 2 in the pixels 20.

The signal voltages read from the pixels 20 selected by the vertical scanning circuit 52 are sent to the column signal processing circuits 56 through the vertical signal lines 24. The column signal processing circuits 56 perform noise suppression signal processing typified by correlated double sampling, analog-digital conversion (A/D conversion), etc. The horizontal signal reading circuit 54 sequentially reads the signals from the column signal processing circuits 56 and outputs the signals to an unillustrated horizontal common signal line.

The vertical scanning circuit 52 may include the above-described voltage supply circuit 30 as a part thereof. Alternatively, the voltage supply circuit 30 may be electrically connected to the vertical scanning circuit 52. In other words, the bias voltage may be applied to each upper electrode 3 through the vertical scanning circuit 52.

In the structure exemplified in FIG. 9, the inverting amplifiers 59 are provided for the respective columns. Negative-side input terminals of the inverting amplifiers 59 are connected to the respective vertical signal lines 24. The output terminal of each inverting amplifier 59 is connected to pixels 20 in a corresponding column through a feedback line 27 provided for this column.

As shown in FIG. 9, the feedback lines 27 are connected to the sources or drains of the reset transistors 46 that are not connected to the charge storage nodes 41 (e.g., to the drains). Therefore, when an address transistor 44 is electrically continuous with a corresponding reset transistor 46, the negative terminal of a corresponding inverting amplifier 59 receives the output of the address transistor 44. A reference voltage for reset is applied to the positive-side input terminal of each inverting amplifier 59 from an unillustrated power source. The inverting amplifiers 59 perform a feedback operation such that the gate voltages of the amplification transistors 42 are adjusted to a prescribed feedback voltage. The feedback voltage is the output voltage of each inverting amplifier 59. The output voltage of the inverting amplifier 59 is, for example, 0 V or a positive voltage near 0 V. The inverting amplifiers 59 may be referred to also as "feedback amplifiers."

[Device Structure of Imaging Device]

Figure 10:
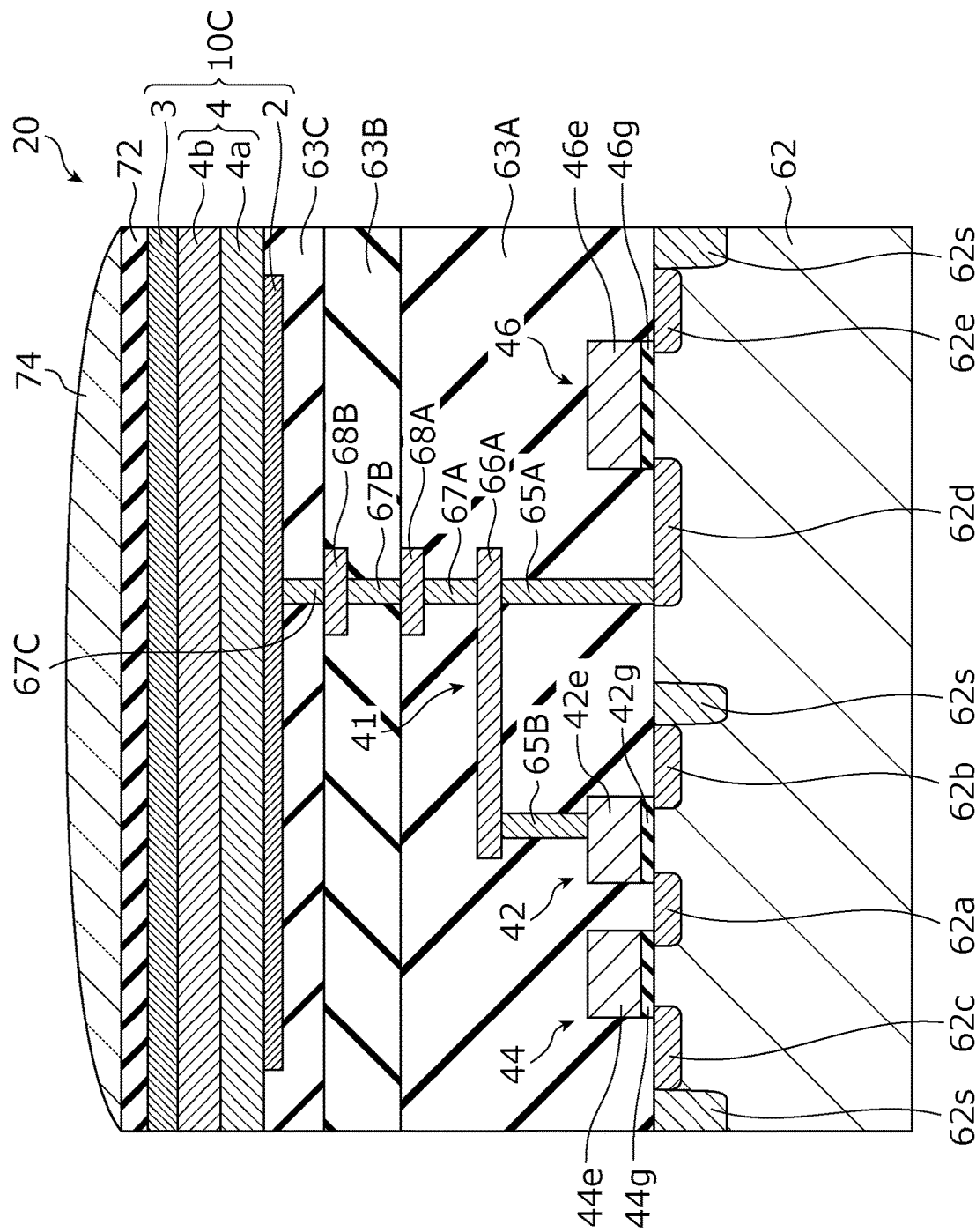
FIG. 10 is a cross-sectional view schematically showing the device structure of a pixel in the imaging device according to embodiment 2.

FIG. 10 is a cross-sectional view schematically showing the device structure of a pixel 20 in the imaging device 100 according to the present embodiment. In the structure exemplified in FIG. 10, the pixel 20 includes a semiconductor substrate 62 that supports the photoelectric converter 10C. The semiconductor substrate 62 is, for example, a silicon substrate. As shown in FIG. 10, the photoelectric converter 10C is disposed above the semiconductor substrate 62. In this example, interlayer insulation layers 63A, 63B, and 63C are stacked on the semiconductor substrate 62. A stack including the lower electrode 2, the photoelectric conversion layer 4, and the upper electrode 3 is disposed on the interlayer insulation layer 63C. The lower electrodes 2 of the pixels are separated from each other. Specifically, the lower electrodes 2 of two adjacent pixels 20 are formed so as to be spatially separated from each other, and the two adjacent lower electrodes 2 are thereby electrically isolated from each other. The photoelectric conversion layer 4 and the upper electrode 3 may be formed so as to extend over pixels 20. When no other photoelectric converter etc. are disposed between the semiconductor substrate 62 and the photoelectric converters 10C as shown in FIG. 10, the lower electrodes 2 may be formed of a material such as a metal.

The amplification transistors 42, the address transistors 44, and the reset transistors 46 are formed on the semiconductor substrate 62.

Each amplification transistor 42 includes: impurity regions 62a and 62b formed in the semiconductor substrate 62; a gate insulating layer 42g disposed on the semiconductor substrate 62; and a gate electrode 42e disposed on the gate insulating layer 42g. The impurity regions 62a and 62b each function as the drain or source of the amplification transistor 42. The impurity regions 62a and 62b and impurity regions 62c, 62d, and 62e described later are, for example, n-type impurity regions.

Each address transistor 44 includes: impurity regions 62a and 62c formed in the semiconductor substrate 62; a gate insulating layer 44g disposed on the semiconductor substrate 62; and a gate electrode 44e disposed on the gate insulating layer 44g. The impurity regions 62a and 62c each function as the drain or source of the address transistor 44. In this example, the amplification transistor 42 and the address transistor 44 share the impurity region 62a, and therefore the source (or drain) of the amplification transistor 42 is electrically connected to the drain (or source) of the address transistor 44.

Each reset transistor 46 includes: impurity regions 62d and 62e formed in the semiconductor substrate 62; a gate insulating layer 46g disposed on the semiconductor substrate 62; and a gate electrode 46e disposed on the gate insulating layer 46g. The impurity regions 62d and 62e each function as the drain or source of the reset transistor 46.

In the semiconductor substrate 62, element isolation regions 62s are provided between adjacent pixels 20 and between the amplification transistors 42 and the reset transistors 46. The element isolation regions 62s electrically isolate adjacent pixels 20 from each other. Since the element isolation regions 62s are disposed between adjacent pixels 20, leakage of signal charges stored in the charge storage nodes 41 is prevented.

Contact plugs 65A connected to the impurity regions 62d of the reset transistors 46, contact plugs 65B connected to the gate electrodes 42e of the amplification transistors 42, and wiring lines 66A connecting the contact plugs 65A to the contact plugs 65B are formed in the interlayer insulation layer 63A. In this manner, the impurity region 62d (e.g., the drain) of each reset transistor 46 is electrically connected to the gate electrode 42e of a corresponding amplification transistor 42. In the structure exemplified in FIG. 10, a plug 67A and a wiring line 68A are further formed in the interlayer insulation layer 63A. A plug 67B and a wiring line 68B are formed in the interlayer insulation layer 63B, and a plug 67C is formed in the interlayer insulation layer 63C, so that the wiring line 66A is electrically connected to the lower electrode 2. The contact plug 65A, the contact plug 65B, the wiring line 66A, the plug 67A, the wiring line 68A, the plug 67B, the wiring line 68B, and the plug 67C are typically formed of a metal.

In the structure exemplified in FIG. 10, a protective layer 72 is disposed on the upper electrode 3. The protective layer 72 is not a substrate disposed so as to support the photoelectric converter 10C. The protective layer 72 is a layer for protecting the photoelectric converter 10C and insulating it from other components. The protective layer 72 may be highly transparent to light with a desired wavelength. Any light-transmitting insulator may be used as the material of the protective layer 72, and examples of such a material include SiON and AlO. The protective layer 72 may have a single layer structure as shown in FIG. 10 or may have a multilayer structure including different material layers stacked one on another. As shown in FIG. 10, a microlens 74 may be disposed on the protective layer 72.

[Structure of Photoelectric Conversion Layer]

In the present embodiment, each photoelectric converter 10C is an example of the photoelectric conversion element and includes the photoelectric conversion element according to embodiment 1. For example, the photoelectric converter 10C has the same structure as the structure of the photoelectric conversion element 10A described above, as shown in FIG. 10. The photoelectric converter 10C may have the same structure as the structure of the photoelectric conversion element 10B described above or may have a structure in which one of the electron blocking layer 5 and the hole blocking layer 6 of the photoelectric conversion element 10B is omitted. [Method for producing imaging device]

The imaging device 100 can be produced using a general semiconductor production process. In particular, when a silicon substrate is used as the semiconductor substrate 62, the imaging device 100 can be produced using various silicon semiconductor processes.

Embodiment 3

Next, embodiment 3 will be described. In embodiment 3, a description will be given of an imaging device that includes a photoelectric converter including the photoelectric conversion element according to embodiment 1 and further includes a photoelectric converter including another photoelectric conversion element. Specifically, embodiment 3 differs from embodiment 2 in that the imaging device includes two photoelectric converters. In the following description, differences between embodiments 2 and 3 will be mainly described, and the description of common features will be omitted or simplified.

Figure 11:
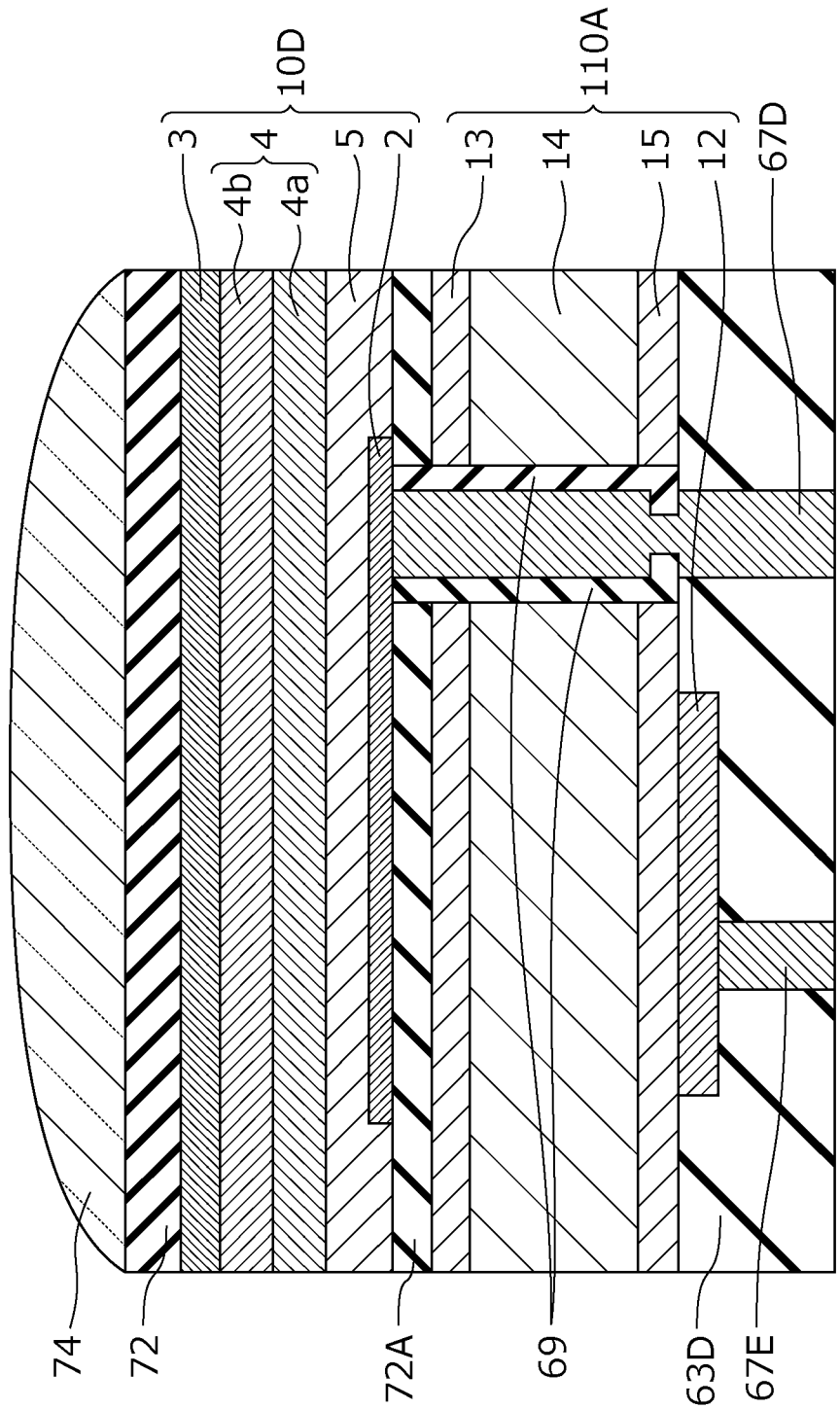
FIG. 11 is a cross-sectional view schematically showing the structure of two photoelectric converters in an imaging device according to embodiment 3.

FIG. 11 is a cross-sectional view schematically showing the structure of two photoelectric converters 10D and 110A of the imaging device according to the present embodiment. The imaging device according to the present embodiment is an example of the electronic device. In the imaging device according to embodiment 3, the photoelectric converter 10D including the photoelectric conversion element according to embodiment 1 and the photoelectric converter 110A are stacked together. The photoelectric converter 110A is located below the photoelectric converter 10D and receives light that has passed through the photoelectric converter 10D on which light is incident from above.

The photoelectric converter 10D is an example of the first photoelectric conversion element and includes the photoelectric conversion element according to embodiment 1. The photoelectric converter 110A is an example of the second photoelectric conversion element and has sensitivity to light passing through the photoelectric converter 10D.

As shown in FIG. 11, for example, the photoelectric converter 10D has a structure in which the hole blocking layer 6 in the photoelectric conversion element 10B described above is omitted, i.e., a structure in which the photoelectric conversion layer 4 is in contact with the upper electrode 3. Specifically, the photoelectric converter 10D includes: a pair of electrodes including the lower electrode 2 and the upper electrode 3; the photoelectric conversion layer 4 located between the lower electrode 2 and the upper electrode 3; and the electron blocking layer 5 located between the photoelectric conversion layer 4 and the lower electrode 2.

The photoelectric converter 10D generates a first signal corresponding to light with at least one of the first wavelength, the second wavelength, and the third wavelength. Specifically, as described above, in the photoelectric converter 10D, the lower electrode 2 collects holes or electrons as signal charges.

The photoelectric converter 110A generates a second signal corresponding to light that has passed through the photoelectric converter 10D and is in at least one of the first wavelength range and the second wavelength range. In the photoelectric converter 110A, a lower electrode 12 collects holes or electrons as signal charges. The photoelectric converter 110A includes: a pair of electrodes including the lower electrode 12 and an upper electrode 13; a photoelectric conversion layer 14 located between the lower electrode 12 and the upper electrode 13; and an electron blocking layer 15 located between the photoelectric conversion layer 14 and the lower electrode 12. The materials described for the upper electrode 3 and the electron blocking layer 5 are used for the upper electrode 13 and the electron blocking layer 15, respectively. The structure of the photoelectric converter 110A is not limited to the structure shown in FIG. 11, and any well-known photoelectric conversion element that absorbs light in at least one of the first wavelength range and the second wavelength range may be used. The photoelectric converter 110A may be, for example, a photo diode disposed in a silicon substrate.

Unlike the upper electrode 13, the lower electrode 12 may not have light transparency and is formed from an electrically conductive material. Examples of the electrically conductive material include: metals such as aluminum and copper; metal nitrides; and polysilicon doped with an impurity to impart electrical conductivity.

The photoelectric conversion layer 14 absorbs light that has passed through the photoelectric converter 10D and is in at least one of the first wavelength range and the second wavelength range to thereby generate electron-hole pairs. For example, a semiconducting inorganic material, a semiconducting organic material, etc. that absorb light in a desired wavelength range can be used as the material of the photoelectric conversion layer 14. The material of the photoelectric conversion layer 14 may be a quantum dot material or a quantum well material having the quantum confinement effect.

As shown in FIG. 11, the photoelectric converter 110A is disposed on an interlayer insulation layer 63D. The photoelectric converter 10D is disposed above the photoelectric converter 110A, and an insulating protective layer 72A is disposed between the photoelectric converter 10D and the photoelectric converter 110A. The insulating protective layer 72A may be formed of the same material as the material of the protective layer 72 described above and insulates the photoelectric converter 10D from the photoelectric converter 110A. The protective layer 72 and the microlens 74 are disposed on the upper electrode 3 of the photoelectric converter 10D, as in embodiment 2.

A plug 67D connected to the lower electrode 2 and a plug 67E connected to the lower electrode 12 are formed in the interlayer insulation layer 63D. The lower electrode 2 and the lower electrode 12 are electrically connected to the wiring lines etc. described in embodiment 2 through the plug 67D and the plug 67E, respectively. Typically, the plug 67D and the plug 67E are formed of a metal. The plug 67D is formed so as to pass through the photoelectric converter 110A. An insulating coating 69 is formed around the plug 67D, and the plug 67D is not in contact with the photoelectric converter 110A. The insulating coating 69 is formed of, for example, $AlO_x$ or SiN.

For example, the photoelectric converter 10D has sensitivity to infrared light and allows visible light to pass therethrough, and the photoelectric converter 110A has sensitivity to the visible light that has passed through the photoelectric converter 10D. Specifically, the second wavelength range of the semi-SWCNTs contained in the photoelectric converter 10D is equal to or longer than 400 nm and equal to or shorter than 650 nm, and the photoelectric converter 110A has sensitivity to light in the wavelength range of 400 nm or longer and 650 nm or shorter.

By stacking the photoelectric converter 10D having sensitivity to infrared light on the photoelectric converter 110A having sensitivity to visible light as shown in FIG. 11, images corresponding two different wavelength ranges can be obtained. Moreover, since the two photoelectric converters are disposed on the same incident optical axis, the imaging device can be reduced in size and can have higher resolution. In the imaging device, since the two photoelectric converters are disposed on the same incident optical axis, no parallax occurs between the images captured by the two photoelectric converters.

In the multilayer structure including these photoelectric converters, a leakage current and a parasitic capacitance occur in the plug 67D that is disposed so as to pass through the photoelectric converter 110A in order to output the signal charges from the upper photoelectric converter 10D, and this cause a reduction in the signal/noise (S/N) ratio of the image obtained. Therefore, from the viewpoint of reducing the influence of a reduction in the quality of a visible light image often recognized visually by humans, the photoelectric converter 110A is disposed on the lower side. In this case, since the upper photoelectric converter 10D includes the photoelectric conversion element according to embodiment 1 that is transparent to visible light to which the lower photoelectric converter 110A has sensitivity, the visible light contained in the light entering the imaging device is allowed to be transmitted to the lower photoelectric converter 110A. Therefore, a visible light image with image deterioration prevented and an infrared light image can be captured using one device and on the same optical axis.

When importance is placed on the quality of the infrared light image, the photoelectric converter 10D may have sensitivity to visible light and allow infrared light to pass therethrough, and the photoelectric converter 110A may have sensitivity to the infrared light that has passed through the photoelectric converter 10D.

Embodiment 4

Next, embodiment 4 will be described. In embodiment 4, a description will be given of a solar cell including the photoelectric conversion element according to embodiment 1. In the imaging device according to embodiment 2, the same components as those in the photoelectric conversion element according to embodiment 1 are denoted by the same reference numerals, and the description of common features will be omitted or simplified.

Figure 12:
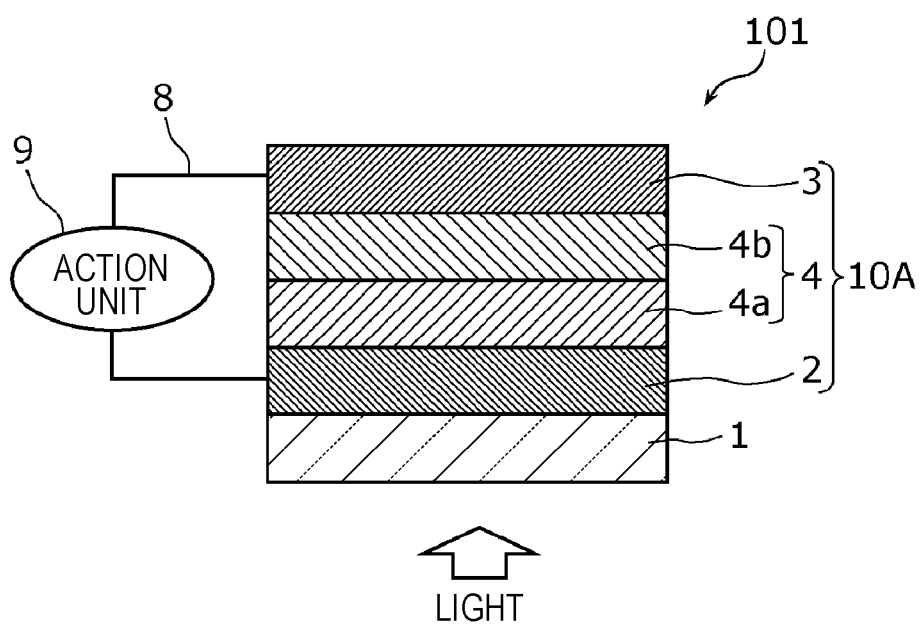
FIG. 12 is a cross-sectional view schematically showing the structure of a solar cell according to embodiment 4.

FIG. 12 is a cross-sectional view schematically showing the structure of the solar cell 101 according to the present embodiment. The solar cell 101 includes: a substrate 1; the photoelectric conversion element 10A according to embodiment 1 and disposed above the substrate 1; and lead lines 8 connected to the lower electrode 2 and the upper electrode 3 of the photoelectric conversion element 10A. For example, light enters the solar cell 101 from the substrate 1 side. Electrons generated by light absorption in the photoelectric conversion layer 4 diffuse and reach the upper electrode 3. The electrons that have reached the upper electrode 3 pass through one of the lead lines 8 and flow to an action unit 9, and the action unit 9 is thereby actuated. The electrons that have flown to the action unit 9 passes through the other lead line 8 and returns to the lower electrode 2 of the photoelectric conversion element 10A. In this manner, the solar cell 101 functions as a battery. The action unit 9 is, for example, a device operated by electric power and is, for example, a driving circuit of an imaging device, a light-emitting element, or a motor. As described above, the photoelectric conversion element 10A absorbs light with at least one of the first wavelength, the second wavelength, and the third wavelength to thereby generate electric power. Since the photoelectric conversion element 10A allows light in the first wavelength range and the second wavelength range to pass therethrough, the transmitted light can be utilized.

The number of photoelectric conversion elements 10A included in the solar cell 101 is not limited to one, and the solar cell may be a solar cell module including: the photoelectric conversion elements 10A disposed on a substrate and arranged in an array; and wiring lines connecting the photoelectric conversion elements 10A.

Embodiment 5

Next, embodiment 5 will be described. In embodiment 5, a description will be given of an electronic device including the photoelectric conversion element according to embodiment 1.

Figure 13:
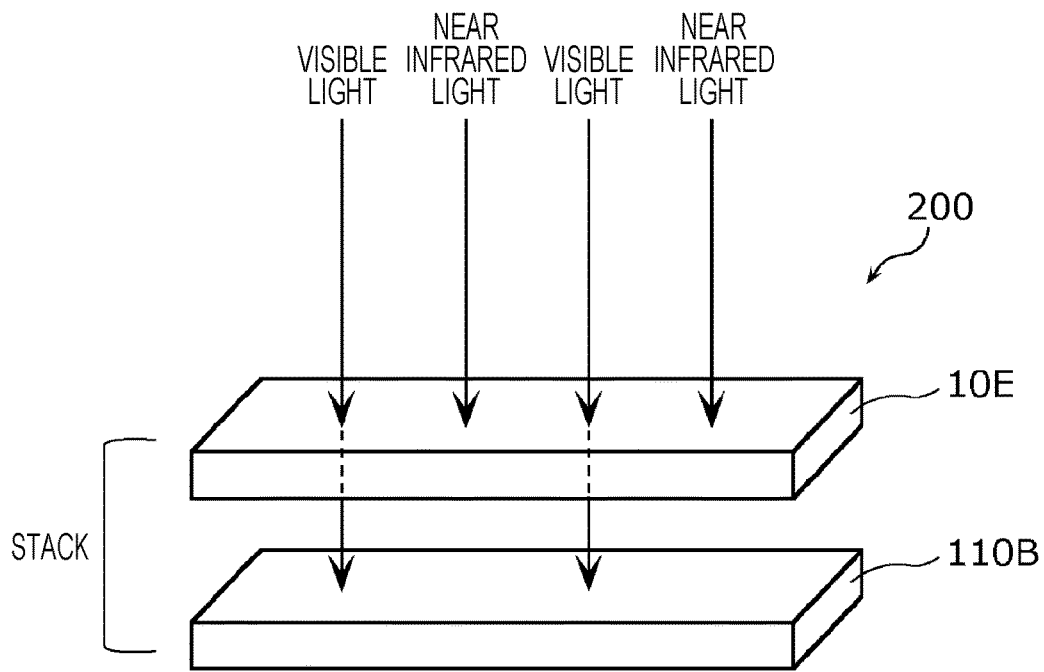
FIG. 13 is a schematic perspective view showing the structure of an electronic device according to embodiment 5.

FIG. 13 is a schematic perspective view illustrating the structure of the electronic device 200 according to the present embodiment. In FIG. 13, components other than photoelectric conversion elements are omitted. As shown in FIG. 13, the electronic device 200 includes a photoelectric conversion element 110B and a photoelectric conversion element 10E disposed above the photoelectric conversion element 110B. Light enters the electronic device 200 from the upper side of the photoelectric conversion element 10E.

The photoelectric conversion element 10E is an example of the first photoelectric conversion element and includes the photoelectric conversion element according to embodiment 1. The photoelectric conversion element 10E allows light in at least one of the first wavelength range and the second wavelength range to pass therethrough.

The photoelectric conversion element 10E generates a first signal corresponding to light with at least one of the first wavelength, the second wavelength, and the third wavelength. In this case, the photoelectric conversion element 10E functions as part of a photosensor or an imaging device. For example, the photoelectric conversion element 10E absorbs light with at least one of the first wavelength, the second wavelength, and the third wavelength to thereby generate electric power. In this case, the photoelectric conversion element 10E functions as part of a solar cell.

The photoelectric conversion element 110B is an example of the second photoelectric conversion element and receives light that has passed through the photoelectric conversion element 10E. For example, the photoelectric conversion element 110B has the same structure as the structure of the photoelectric converter 110A in embodiment 3 or may have the same structure as the structure of a well-known photoelectric conversion element. As shown in FIG. 13, for example, the photoelectric conversion element 10E absorbs infrared light and allows visible light to pass therethrough, and the photoelectric conversion element 110B receives the visible light that has passed through the photoelectric conversion element 10E.

The photoelectric conversion element 110B generates, for example, a second signal corresponding to light in at least one of the first wavelength range and the second wavelength range. In this case, the photoelectric conversion element 110B functions as part of a photosensor or an imaging device. For example, the photoelectric conversion element 110B absorbs light in at least one of the first wavelength range and the second wavelength range to thereby generate electric power. In this case, the photoelectric conversion element 110B functions as part of a solar cell.

The electronic device 200 includes, for example: a solar cell including one of the photoelectric conversion element 10E and the photoelectric conversion element 110B; and a photosensor or an imaging device including the other one of the photoelectric conversion element 10E and the photoelectric conversion element 110B. Since the two photoelectric conversion elements are disposed on the same incident optical axis, the electronic device 200 can be smaller than an electronic device including two photoelectric conversion elements arranged in the same plane.

In the electronic device 200 according to the present embodiment, part of the electric power generate by the solar cell including one of the photoelectric conversion element 10E and the photoelectric conversion element 110B can be used as at least part of the electric power for the photosensor or imaging device including the other one of the photoelectric conversion element 10E and the photoelectric conversion element 110B.

Therefore, the electronic device 200 obtained is a power-saving device. Since it is unnecessary to provide a large driving battery, the electronic device 200 can be further reduced in size.

The electronic device 200 may include a solar cell including both the photoelectric conversion element 10E and the photoelectric conversion element 110B. In this case, electric power can be generated using light in two different wavelength ranges, so that the power generation efficiency of the solar cell is improved. The electronic device 200 may include a photosensor or an imaging device including both the photoelectric conversion element 10E and the photoelectric conversion element 110B.

Embodiment 6

Next, embodiment 6 will be described. In embodiment 6, a description will be given of a light-emitting device including the photoelectric conversion element according to embodiment 1.

Figure 14:
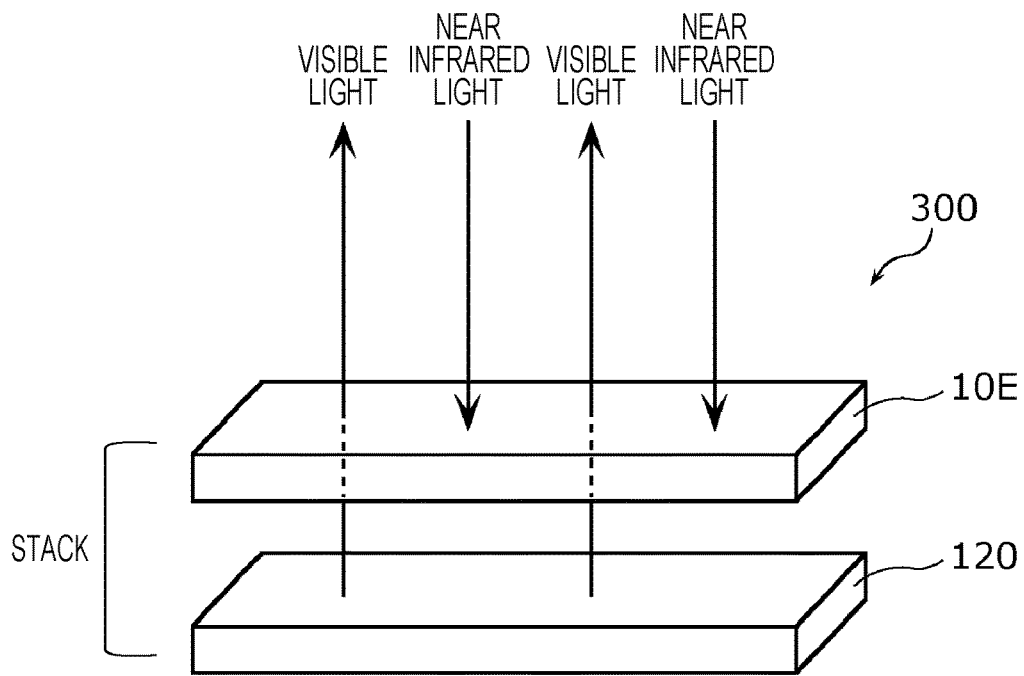
FIG. 14 is a schematic perspective view showing the structure of a light-emitting device according to embodiment 6.

FIG. 14 is a schematic perspective view illustrating the structure of the light-emitting device 300 according to the present embodiment. In FIG. 14, components other than the photoelectric conversion element and a light-emitting element are omitted. As shown in FIG. 14, the light-emitting device 300 includes: the light-emitting element 120 and the photoelectric conversion element 10E disposed above the light-emitting surface of the light-emitting element 120.

The light-emitting element 120 emits light in at least one of the first wavelength range and the second wavelength range. The light-emitting element 120 functions as part of a display or a light-emitting module such as a lighting fixture. The light-emitting element 120 may be, for example, a light-emitting diode (LED), a semiconductor laser, an organic EL (Electro Luminescence) device, or an inorganic EL device.

Since the photoelectric conversion element 10E has been described in embodiment 5, the description thereof will be omitted.

As shown in FIG. 14, for example, the photoelectric conversion element 10E absorbs infrared light and allows visible light emitted from the light-emitting element 120 to pass therethrough. Therefore, even when the photoelectric conversion element 10E is disposed on the optical axis of the light emitted from the light-emitting element 120, the visible light emitted from the light-emitting element 120 can pass through the photoelectric conversion element 10E, so that the light-emitting function of the light-emitting device 300 is not impaired. In the light-emitting device 300, since the photoelectric conversion element 10E is disposed on the optical axis of the light emitted from the light-emitting element 120 as described above, the light-emitting device 300 can be reduced in size.

The light-emitting device 300 includes, for example: a display or a lighting fixture including the light-emitting element 120; and a solar cell, a photosensor, or a imaging device including the photoelectric conversion element 10E.

In the light-emitting device 300 according to the present embodiment, when the photoelectric conversion element 10E functions as part of an image sensor or a photosensor, the brightness of the lighting fixture including the light-emitting element 120 can be controlled according to the results of detection of an object, and the contents displayed on the display including the light-emitting element 120 can be changed according to the detection results, so that the light-emitting device 300 obtained is a power-saving device. When the photoelectric conversion element 10E functions as part of a solar cell, the photoelectric conversion element 10E can generate at least part of the electric power for a light-emitting module including the light-emitting element 120, and therefore the light-emitting device 300 obtained is a power-saving device.

OTHER EMBODIMENTS

One or more modes of each of the photoelectric conversion element, the imaging device, the solar cell, the electronic device, and the light-emitting device have been described based on the embodiments. However, the present disclosure is not limited to these embodiments. Various modifications to the embodiments that are conceivable by a person of skill in the art and modes obtained by combining components in different embodiments are also included in the scope of the present disclosure, so long as they do not depart from the spirit of the present disclosure.

The photoelectric conversion element etc. according to the present disclosure are applicable to, for example, solar cells, sensor systems, and various camera systems such as medical cameras, monitoring cameras, vehicle-mounted cameras, range cameras, microscope cameras, cameras for drones, and cameras for robots.

What is claimed is:

1. A photoelectric conversion element comprising:
a first electrode;
a second electrode; and
a photoelectric conversion layer disposed between the first electrode and the second electrode and containing semiconducting carbon nanotubes and a first material that functions as a donor or an acceptor for the semiconducting carbon nanotubes, wherein:
the semiconducting carbon nanotubes have light absorption characteristics including a first absorption peak at a first wavelength, a second absorption peak at a second wavelength shorter than the first wavelength, and a third absorption peak at a third wavelength shorter than the second wavelength,
the first material is transparent to light in at least one wavelength range selected from the group consisting of a first wavelength range between the first wavelength and the second wavelength and a second wavelength range between the second wavelength and the third wavelength, and
the first material is transparent to light in a wavelength range of 400 nm or longer and 650 nm or shorter, and the first material has an energy gap equal to or smaller than 3.1 eV.

2. The photoelectric conversion element according to claim 1, wherein the second wavelength range includes a wavelength range of 400 nm or longer and 650 nm or shorter.

3. The photoelectric conversion element according to claim 1, wherein the first wavelength is equal to or longer than 1300 nm and equal to or shorter than 1600 nm.

4. The photoelectric conversion element according to claim 3, wherein the semiconducting carbon nanotubes include a semiconducting carbon nanotube having at least one chirality selected from the group consisting of (8,7), (14,0), (13,2), (9,7), (11,4), (12,2), (12,4), (10,6), (13,0), (11,6), (9,8), (15,1), (14,3), (10,8), (13,3), (14,1), (13,5), (12,5), (11,7), (17,0), (12,7), (16,2), and (10,9).

5. The photoelectric conversion element according to claim 1, wherein the first material contains at least one selected from the group consisting of BT-CIC and CO$_8$DFIC.

6. The photoelectric conversion element according to claim 1, wherein the semiconducting carbon nanotubes have a uniform diameter.

7. The photoelectric conversion element according to claim 1, wherein the first wavelength is equal to or longer than 1500 nm and equal to or shorter than 1800 nm.

8. The photoelectric conversion element according to claim 7, wherein the semiconducting carbon nanotubes include a semiconducting carbon nanotube having at least one chirality selected from the group consisting of (10,8), (13,3), (14,1), (13,5), (12,5), (11,7), (17,0), (12,7), (16,2), (10,9), (15,4), (14,4), (15,2), (16,0), (13,6), (11,9), (14,6), (12,8), (18,1), (13,8), (17,3), (11,10), (16,3), (16,5), (17,1), and (15,5).

9. The photoelectric conversion element according to claim 1, wherein the semiconducting carbon nanotubes have diameters within ±10% of an average diameter of the semiconducting carbon nanotubes.

10. The photoelectric conversion element according to claim 1, wherein the semiconducting carbon nanotubes have a same chirality.

11. An electronic device comprising:
a first photoelectric conversion element; and
a second photoelectric conversion element that has a different optical absorption property than the first photoelectric conversion element and receives light that has passed through the first photoelectric conversion element, wherein:
the first photoelectric conversion element comprises:
a first electrode;
a second electrode; and
a first photoelectric conversion layer disposed between the first electrode and the second electrode and containing semiconducting carbon nanotubes and a first material that functions as a donor or an acceptor for the semiconducting carbon nanotubes,
the semiconducting carbon nanotubes have light absorption characteristics including a first absorption peak at a first wavelength, a second absorption peak at a second wavelength shorter than the first wavelength, and a third absorption peak at a third wavelength shorter than the second wavelength, and
the first material is transparent to light in at least one wavelength range selected from the group consisting of a first wavelength range between the first wavelength and the second wavelength and a second wavelength range between the second wavelength and the third wavelength,
the second photoelectric conversion element comprises:
a third electrode;
a fourth electrode; and
a second photoelectric conversion layer disposed between the third electrode and the fourth electrode.

12. The electronic device according to claim 11, wherein
the first photoelectric conversion element generates a first signal corresponding to light with at least one wavelength selected from the group consisting of the first wavelength, the second wavelength, and the third wavelength, and
the second photoelectric conversion element generates a second signal corresponding to light that has passed through the first photoelectric conversion element and that is in at least one wavelength range selected from the group consisting of the first wavelength range and the second wavelength range.

13. The electronic device according to claim 11, wherein
the first photoelectric conversion element absorbs light with at least one wavelength selected from the group consisting of the first wavelength, the second wavelength, and the third wavelength to generate electric power, and
the second photoelectric conversion element generates a signal corresponding to light that has passed through the first photoelectric conversion element and that is in at least one wavelength range selected from the group consisting of the first wavelength range and the second wavelength range.

14. The electronic device according to claim 11, wherein
the first photoelectric conversion element generates a signal corresponding to light with at least one wavelength selected from the group consisting of the first wavelength, the second wavelength, and the third wavelength, and
the second photoelectric conversion element absorbs light that has passed through the first photoelectric conversion element and that is in at least one wavelength range selected from the group consisting of the first wavelength range and the second wavelength range to generate electric power.

15. The electronic device according to claim 11, wherein the first material is transparent to light in a wavelength range of 400 nm or longer and 650 nm or shorter, and the first material has an energy gap equal to or smaller than 3.1 eV.

16. A light-emitting device comprising:

a light-emitting element; and the photoelectric conversion element according to claim 1, the photoelectric conversion element being disposed above a light-emitting surface of the light-emitting element, wherein the light-emitting element emits light in at least one wavelength range selected from the group consisting of the first wavelength range and the second wavelength range, and the photoelectric conversion element absorbs light with at least one wavelength selected from the group consisting of the first wavelength, the second wavelength, and the third wavelength to generate electric power or generates a signal corresponding to light with at least one wavelength selected from the group consisting of the first wavelength, the second wavelength, and the third wavelength.

* * * * *